(12) United States Patent
Lin et al.

(10) Patent No.: US 10,998,417 B2
(45) Date of Patent: May 4, 2021

(54) SEMICONDUCTOR DEVICE AND METHOD OF MANUFACTURING THE SAME

(71) Applicant: TAIWAN SEMICONDUCTOR MANUFACTURING CO., LTD., Hsinchu (TW)

(72) Inventors: Chun-Hsiung Lin, Zhubei (TW); Chia-Hao Chang, Hsinchu (TW); Chih-Hao Wang, Baoshan Township (TW); Wai-Yi Lien, Hsinchu (TW); Chih-Chao Chou, Hsinchu (TW); Pei-Yu Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/001,501

(22) Filed: Aug. 24, 2020

(65) Prior Publication Data

US 2020/0388692 A1 Dec. 10, 2020

Related U.S. Application Data

(60) Continuation of application No. 16/585,741, filed on Sep. 27, 2019, now Pat. No. 10,756,197, which is a (Continued)

(51) Int. Cl.
*H01L 29/49* (2006.01)
*H01L 29/66* (2006.01)
(Continued)

(52) U.S. Cl.
CPC .... *H01L 29/4991* (2013.01); *H01L 21/28123* (2013.01); *H01L 21/764* (2013.01);
(Continued)

(58) Field of Classification Search
CPC ............. H01L 29/6653; H01L 29/4991; H01L 29/66545; H01L 29/66795; H01L 21/764; H01L 21/7682
See application file for complete search history.

(56) References Cited

U.S. PATENT DOCUMENTS 9,190,486 B2 11/2015 Xie et al.
9,735,047 B1 8/2017 Chang et al.
(Continued)

FOREIGN PATENT DOCUMENTS

DE 102012217491 A1 4/2013
KR 2005-0121521 A 12/2005
(Continued)

OTHER PUBLICATIONS

Cheng, K., "Air Spacer for 10m FinFET CMOS and Beyond," Sep. 2016, IEDM16-444-IEDM16-447.
(Continued)

*Primary Examiner* — Zandra V Smith
*Assistant Examiner* — John M Parker
(74) *Attorney, Agent, or Firm* — McDermott Will & Emery LLP

(57) ABSTRACT

In a method for manufacturing a semiconductor device, a gate structure is formed over a channel layer and an isolation insulating layer. A first sidewall spacer layer is formed on a side surface of the gate structure. A sacrificial layer is formed so that an upper portion of the gate structure with the first sidewall spacer layer is exposed from the sacrificial layer and a bottom portion of the gate structure with the first sidewall spacer layer is embedded in the first sacrificial layer. A space is formed between the bottom portion of the gate structure and the sacrificial layer by removing at least part of the first sidewall spacer layer. After the first sidewall spacer layer is removed, an air gap is formed between the
(Continued)

bottom portion of the gate structure and the sacrificial layer by forming a second sidewall spacer layer over the gate structure.

20 Claims, 13 Drawing Sheets

Related U.S. Application Data division of application No. 15/801,171, filed on Nov. 1, 2017, now Pat. No. 10,510,860.

(60) Provisional application No. 62/551,669, filed on Aug. 29, 2017.

(51) Int. Cl.
| | |
|---|---|
| H01L 29/78 | (2006.01) |
| H01L 21/764 | (2006.01) |
| H01L 21/28 | (2006.01) |
| H01L 27/092 | (2006.01) |
| H01L 21/8238 | (2006.01) |

(52) U.S. Cl.
CPC .. *H01L 21/823821* (2013.01); *H01L 27/0924* (2013.01); *H01L 29/66545* (2013.01); *H01L 29/66795* (2013.01); *H01L 29/785* (2013.01); *H01L 29/7851* (2013.01)

(56) References Cited

U.S. PATENT DOCUMENTS

| | | | |
|---|---|---|---|
| 10,178,309 B2 | 1/2019 | Lin | |
| 2002/0163036 A1 | 11/2002 | Miura et al. | |
| 2011/0121398 A1* | 5/2011 | Hoentschel | H01L 29/7843 |
| | | | 257/369 |
| 2014/0024192 A1 | 1/2014 | Kim et al. | |
| 2014/0110798 A1 | 4/2014 | Cai et al. | |
| 2015/0004804 A1 | 1/2015 | Orihashi et al. | |
| 2015/0091089 A1 | 4/2015 | Niebojewski et al. | |
| 2015/0179651 A1 | 6/2015 | Park et al. | |
| 2016/0163816 A1 | 6/2016 | Yu et al. | |
| 2016/0365426 A1 | 12/2016 | Ching et al. | |
| 2017/0084714 A1 | 3/2017 | Ching et al. | |
| 2017/0162650 A1 | 6/2017 | Cheng et al. | |

FOREIGN PATENT DOCUMENTS

| | | |
|---|---|---|
| KR | 10-2014-0012443 A | 2/2014 |
| KR | 10-2016-0147625 A | 12/2016 |
| TW | 201426907 A | 7/2014 |
| TW | 201712866 A | 4/2017 |
| TW | 201725701 A | 7/2017 |

OTHER PUBLICATIONS

Non-final Office Action issued in related U.S. Appl. No. 15/801,171, dated Feb. 7, 2019.

Notice of Allowance issued in related U.S. Appl. No. 15/801,171, dated Aug. 7, 2019.

Non-Final Office Action issued in U.S. Appl. No. 16/585,741, dated Jan. 9, 2020.

Notice of Allowance issued in U.S. Appl. No. 161585,741, dated Apr. 17, 2020.

\* cited by examiner

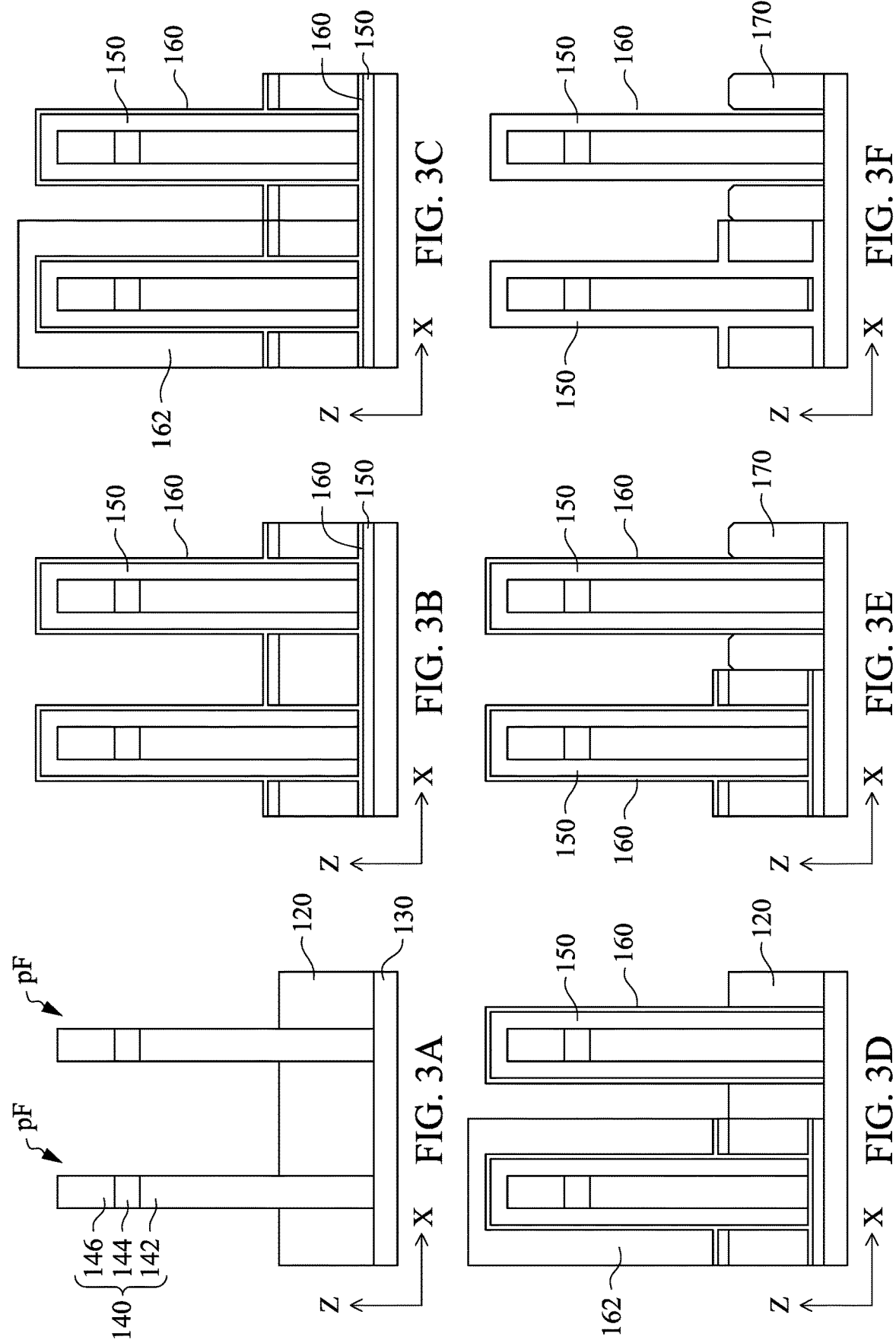

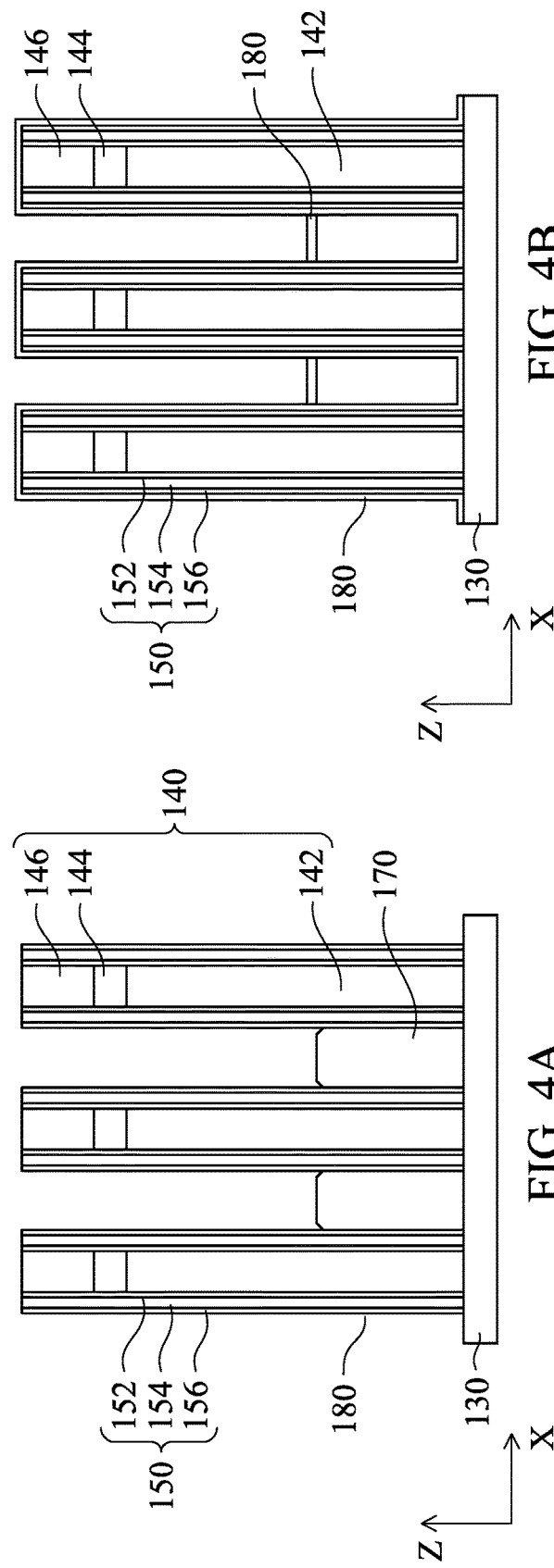
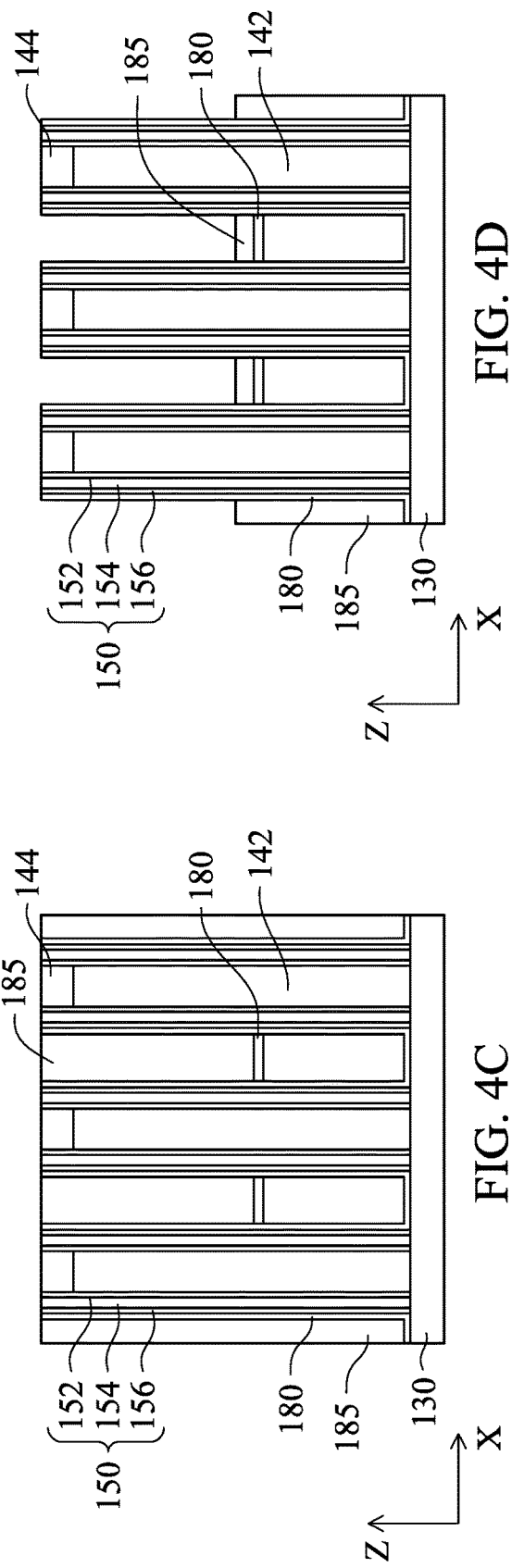

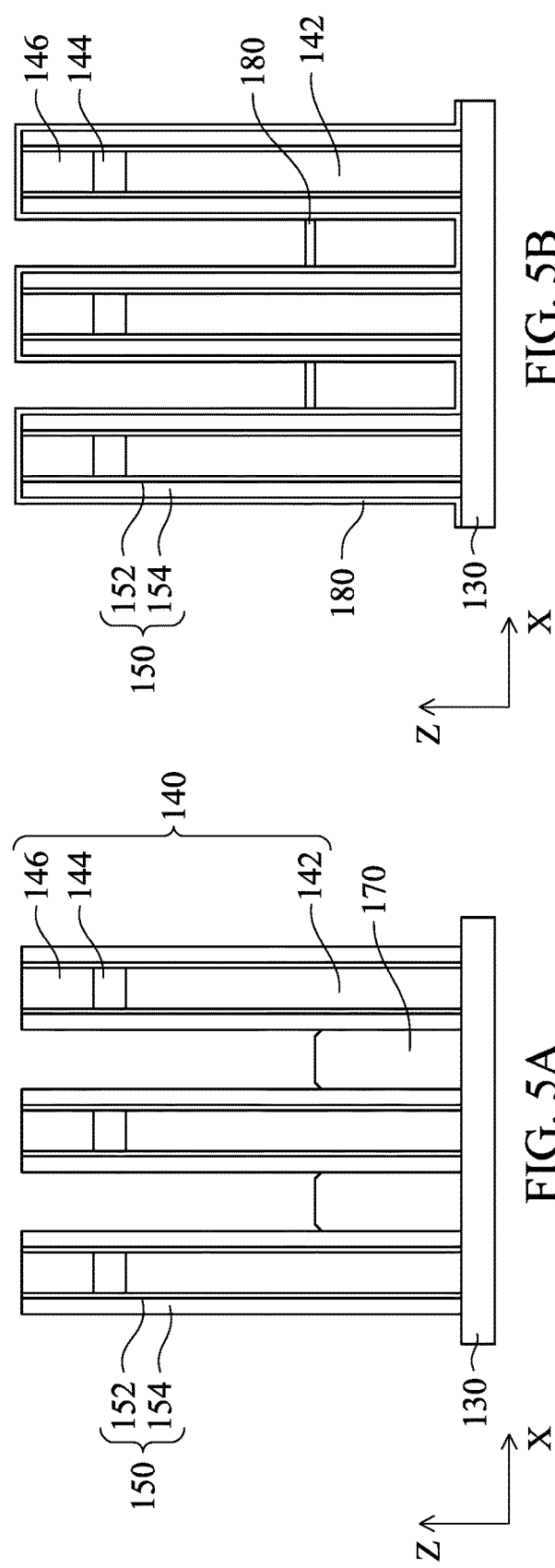
FIG. 5A
FIG. 5B
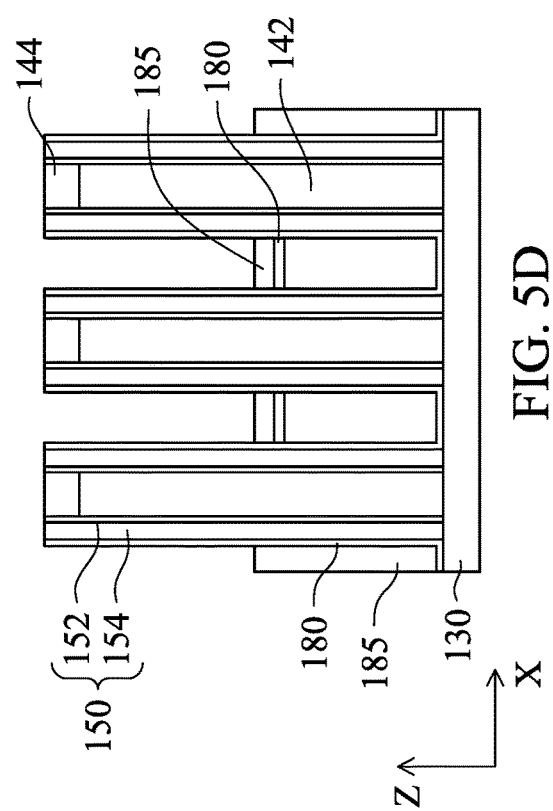
FIG. 5C
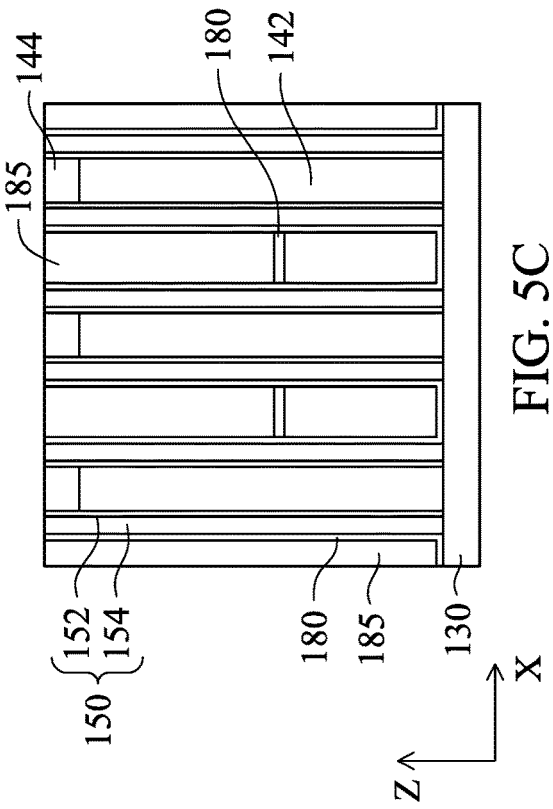
FIG. 5D

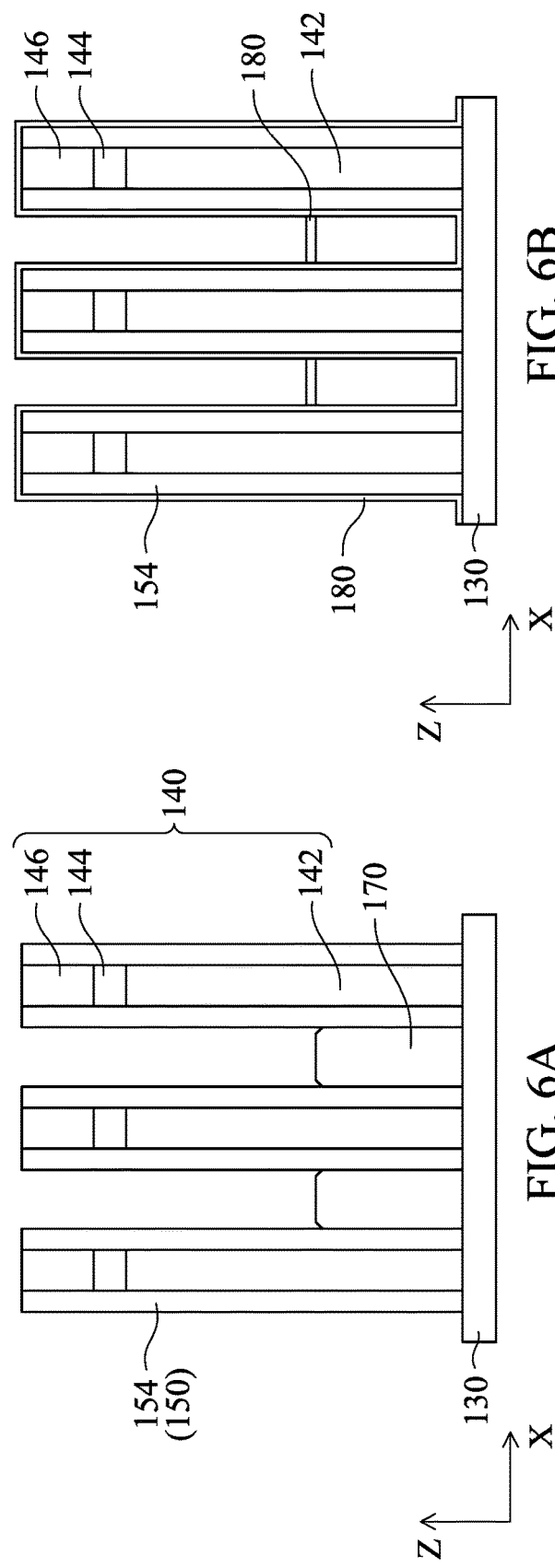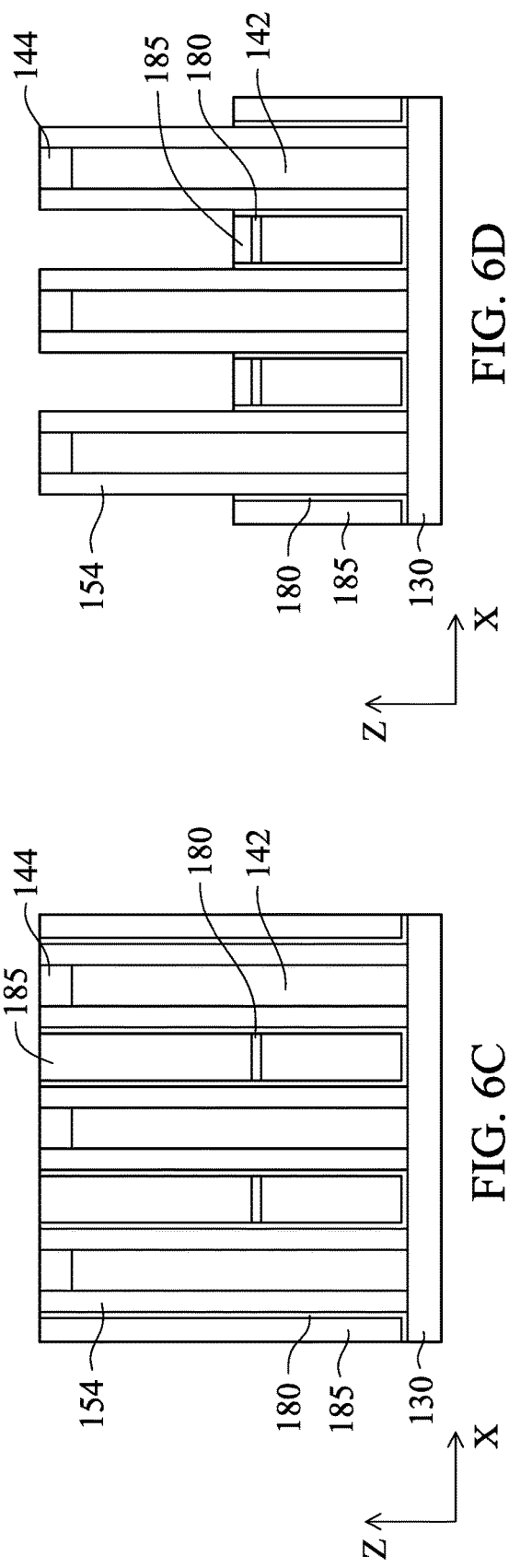
FIG. 6A    FIG. 6B    FIG. 6C    FIG. 6D

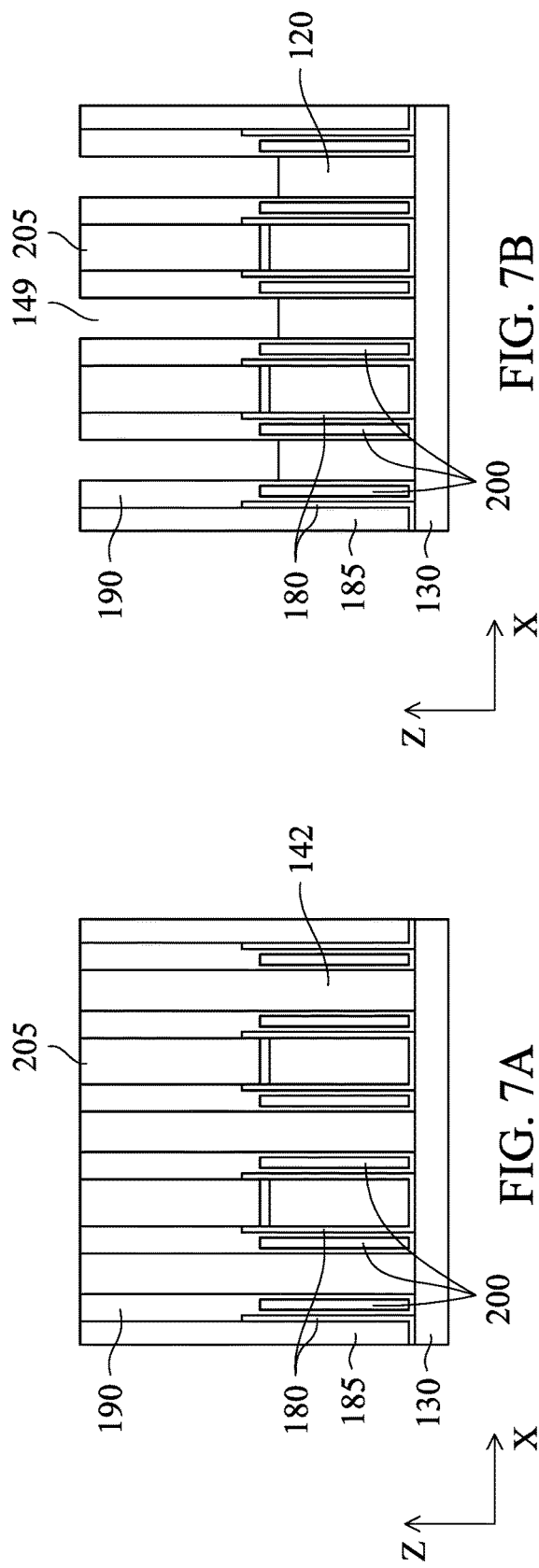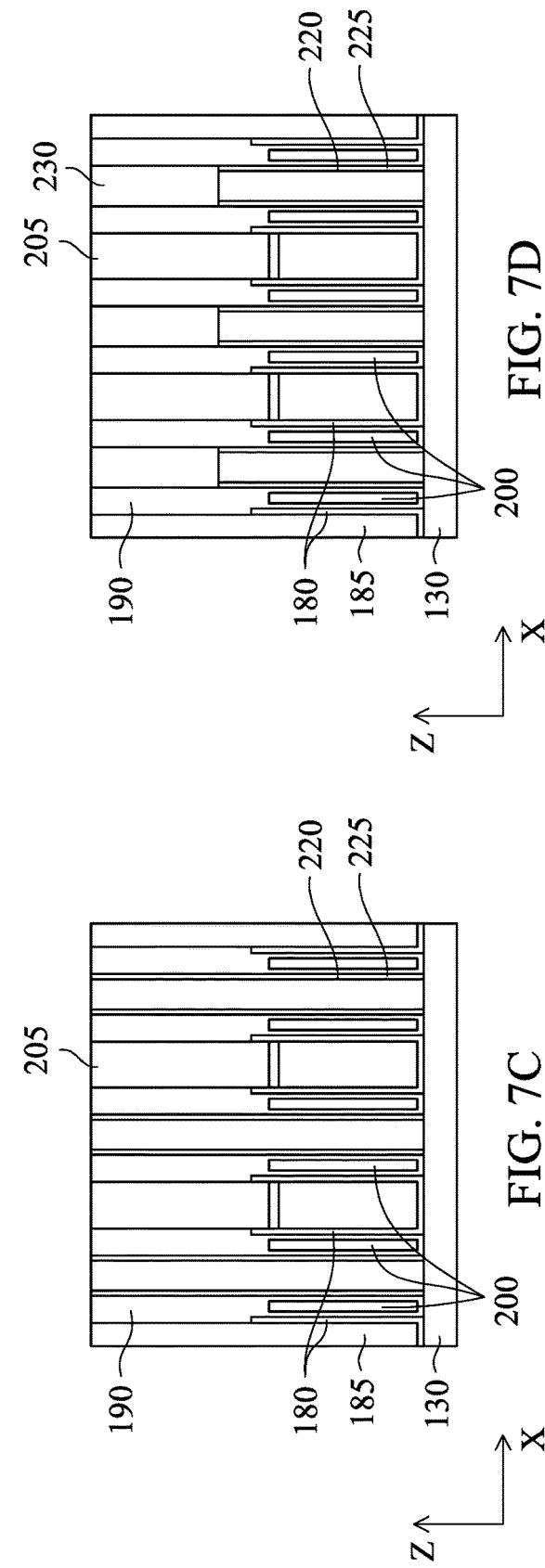

SEMICONDUCTOR DEVICE AND METHOD OF MANUFACTURING THE SAME

This application is a continuation of application Ser. No. 16/585,741 filed on Sep. 27, 2019, which is a divisional of application Ser. No. 15/801,171 filed on Nov. 1, 2017, now U.S. Pat. No. 10,510,860, which claims priority of Provisional Application No. 62/551,669 filed on Aug. 29, 2017, the entire contents of each of which are incorporated herein by reference.

TECHNICAL FIELD

The disclosure relates to methods of manufacturing semiconductor integrated circuits, and more particularly to a method of manufacturing semiconductor devices including fin field effect transistors (FinFETs), and semiconductor devices.

BACKGROUND

As the semiconductor industry introduces new generations of integrated circuits (ICs) having higher performance and greater functionality, the density of the elements that form the ICs is increased, while the dimensions and spacing between components or elements of the ICs are reduced, which causes a variety of problems. For example, for any two adjacent conductive features, when the distance between the conductive features decreases, the resulting capacitance (parasitic capacitance) increases. The increased capacitance results in an increase of power consumption and an increase in the resistive-capacitive (RC) time constant, i.e., an increase of signal delays. The capacitance between two adjacent conductive features is a function of the dielectric constant (k value) of an insulating material filled in the space between the conductive features (also, a function of a distance between the conductive features and a size of the side surfaces of the conductive features). Therefore, the continuing improvement in semiconductor IC performance and functionality is dependent upon developing insulating (dielectric) materials with low k values. Since the substance with the lowest dielectric constant is air (k=1.0), air-gaps are formed to further reduce the effective k value of conductive layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A shows a plan (top) view, FIG. 2B shows a cross sectional view corresponding to line X1-X1 of FIG. 2A, and FIG. 2C shows a cross sectional view corresponding to line Y1-Y1 of FIG. 2A.

FIG. 3A illustrates one of the various stages of a semiconductor device fabrication process in accordance with an embodiment of the present disclosure.

FIG. 3B illustrates one of the various stages of a semiconductor device fabrication process in accordance with an embodiment of the present disclosure.

FIG. 3C illustrates one of the various stages of a semiconductor device fabrication process in accordance with an embodiment of the present disclosure.

FIG. 3D illustrates one of the various stages of a semiconductor device fabrication process in accordance with an embodiment of the present disclosure.

FIG. 3E illustrates one of the various stages of a semiconductor device fabrication process in accordance with an embodiment of the present disclosure.

FIG. 3F illustrates one of the various stages of a semiconductor device fabrication process in accordance with an embodiment of the present disclosure.

FIG. 4A illustrates one of the various stages of a semiconductor device fabrication process in accordance with an embodiment of the present disclosure.

FIG. 4B illustrates one of the various stages of a semiconductor device fabrication process in accordance with an embodiment of the present disclosure.

FIG. 4C illustrates one of the various stages of a semiconductor device fabrication process in accordance with an embodiment of the present disclosure.

FIG. 4D illustrates one of the various stages of a semiconductor device fabrication process in accordance with an embodiment of the present disclosure.

FIG. 5A illustrates one of the various stages of a semiconductor device fabrication process in accordance with another embodiment of the present disclosure.

FIG. 5B illustrates one of the various stages of a semiconductor device fabrication process in accordance with another embodiment of the present disclosure.

FIG. 5C illustrates one of the various stages of a semiconductor device fabrication process in accordance with another embodiment of the present disclosure.

FIG. 5D illustrates one of the various stages of a semiconductor device fabrication process in accordance with another embodiment of the present disclosure.

FIG. 6A illustrates one of the various stages of a semiconductor device fabrication process in accordance with another embodiment of the present disclosure.

FIG. 6B illustrates one of the various stages of a semiconductor device fabrication process in accordance with another embodiment of the present disclosure.

FIG. 6C illustrates one of the various stages of a semiconductor device fabrication process in accordance with another embodiment of the present disclosure.

FIG. 6D illustrates one of the various stages of a semiconductor device fabrication process in accordance with another embodiment of the present disclosure.

FIG. 7A illustrates one of the various stages of a semiconductor device fabrication process in accordance with an embodiment of the present disclosure.

FIG. 7B illustrates one of the various stages of a semiconductor device fabrication process in accordance with an embodiment of the present disclosure.

FIG. 7C illustrates one of the various stages of a semiconductor device fabrication process in accordance with an embodiment of the present disclosure.

FIG. 7D illustrates one of the various stages of a semiconductor device fabrication process in accordance with an embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations inbetween the described operations, and the order of operations may be changed.

Disclosed embodiments relate to a semiconductor having an air gap in a sidewall spacer of a gate electrode of a field effect transistor (FET) and its manufacturing method. In some embodiments, the FET is a fin field-effect transistor (FinFET). The embodiments such as those disclosed herein are generally applicable not only to FinFETs but also to double-gate, surround-gate, omega-gate or gate-all-around (GAA) transistors, 2-dimensional FET and/or nanowire transistors, or any suitable device having a gate sidewall spacer.

Figure 1A:
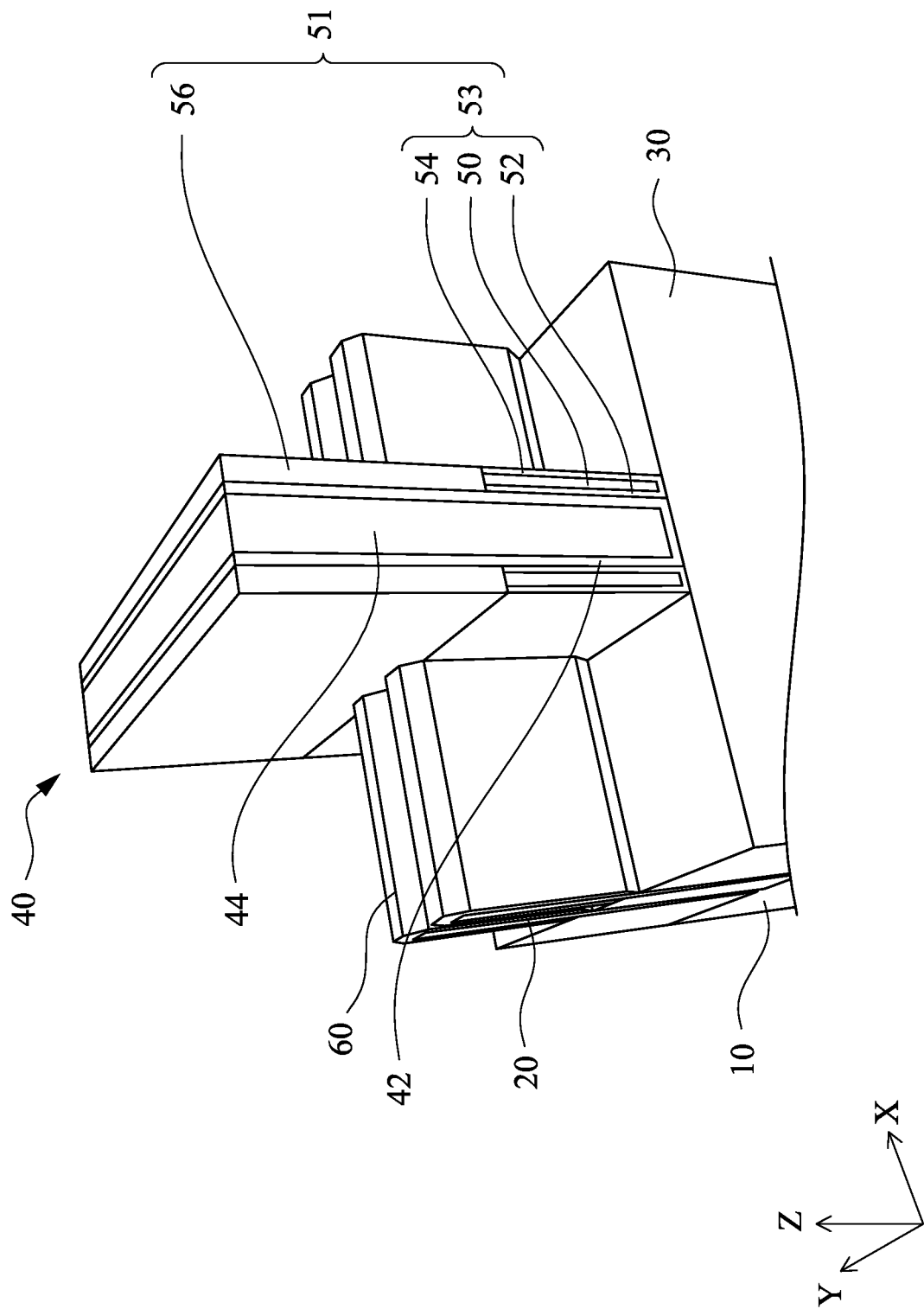
FIG. 1A illustrates a perspective view of a semiconductor device having air gaps adjacent to a gate electrode in accordance with an embodiment of the present disclosure.
Figure 1B:
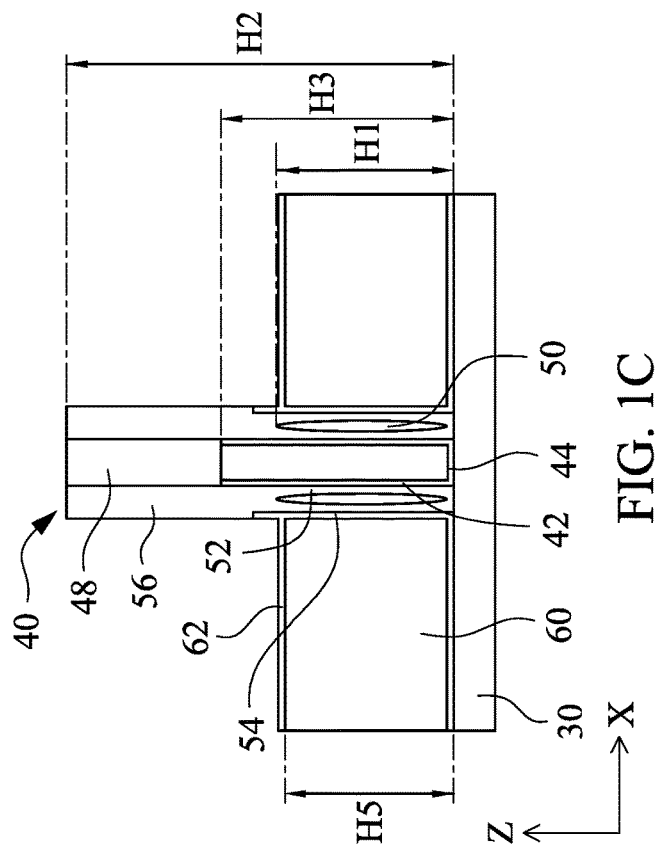
FIGS. 1B and 1C illustrate mixed views of a cross sectional view and a side view of a semiconductor device having air gaps adjacent to a gate electrode in accordance with an embodiment of the present disclosure.
Figure 1C:
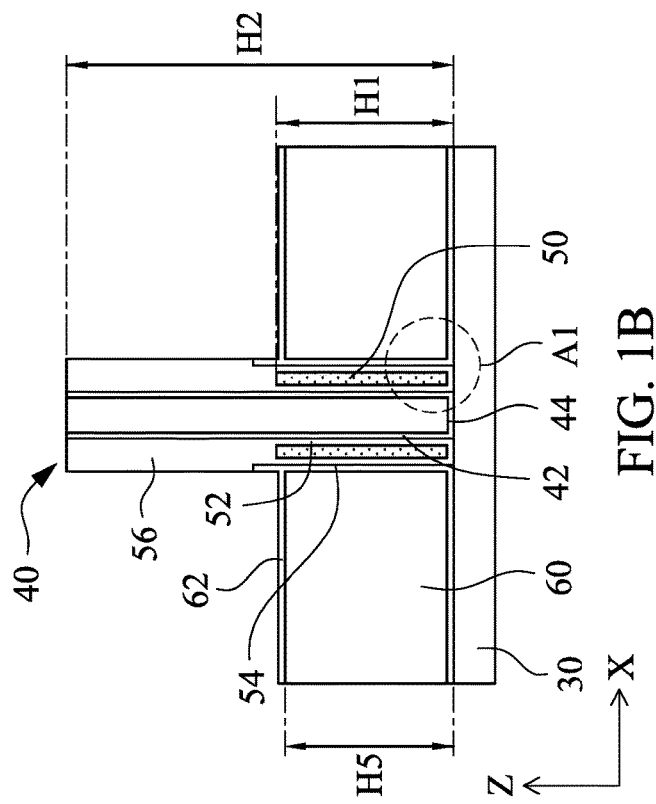
Figure 1D:
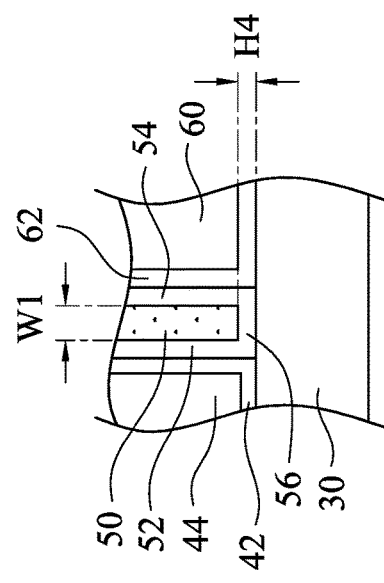
FIG. 1D is an enlarged view corresponding to area A1 of FIG. 1B.

FIGS. 1A-1D illustrate various views of a semiconductor device having an air gap in accordance with embodiments of the present disclosure. FIG. 1A illustrates a perspective view of a semiconductor device having air gaps adjacent to a gate electrode in accordance with an embodiment of the present disclosure. FIGS. 1B and 1C illustrate mixed views of a cross sectional view and a side view of a semiconductor device having air gaps adjacent to a gate electrode in accordance with an embodiment of the present disclosure. FIG. 1D is an enlarged view corresponding to area A1 of FIG. 1B. In the following embodiments, there may be one or more additional elements, such as a layer, a portion, a region or an area, which may not be illustrated for simplicity.

FIGS. 1A-1D illustrate the structure after various manufacturing operations to form a FinFET structure are performed. As shown in FIGS. 1A-1C, a source/drain structure 60 and a gate 40 including a gate electrode layer 44 and a gate dielectric layer 42 are formed over a substrate 10. In FIGS. 1A-1D, the semiconductor device includes the substrate 10 having one or more fin structures 20, for example, two fin structures. It is understood that two fin structure is illustrated for purposes of illustration, but other embodiments may include any number of fin structures. In some embodiments, one or more dummy fin structures are formed adjacent to the fin structure of an active FinFET. The fin structures 20 extend in the X direction and protrude from an isolation insulating layer 30 (shallow trench isolation (STI)) disposed over the substrate in the Z direction, while the gate 40 extends in the Y direction.

The substrate 10 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In some embodiments, the substrate 10 may be made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 10 may include an epitaxial layer (epi-layer), which may be strained for performance enhancement, and/or may include a silicon-on-insulator (SOI) structure.

The gate structure 40 is disposed over part of the fin structures 20. A source/drain epitaxial layer 60 is formed over the fin structures not covered by the gate structure 40. The gate structure 40 includes a gate electrode layer 44 and a gate dielectric layer 42. In some embodiments, the gate electrode layer 44 includes a metallic material selected from the group consisting of W, Cu, Ti, Ag, Al, TiAl, TiAlN, TaC, TaCN, TaSiN, Mn, Co, Pd, Ni, Re, Jr, Ru, Pt, and Zr. In some embodiments, the gate electrode layer 44 includes a metal selected from a group consisting of TiN, WN, TaN, and Ru. Metal alloys such as Ti—Al, Ru—Ta, Ru—Zr, Pt—Ti, Co—Ni and Ni—Ta may be used and/or metal nitrides such as $WN_x$, $TiN_x$, $MoN_x$, $TaN_x$, and $TaSi_xN_y$ may be used. The gate electrode layer 44 may be formed using a suitable process such as atomic layer deposition (ALD), chemical vapor deposition (CVD), physical vapor deposition (PVD), plating, or combinations thereof.

In certain embodiments of the present disclosure, the gate electrode layer 44 includes one or more work function adjustment layers (not shown) disposed on the gate dielectric layer 42. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FinFET, one or more of TaN, TaAlC, TiN, TiC, Co, TiAl, HfTi, TiSi and TaSi is used as the work function adjustment layer, and for the p-channel FinFET, one or more of TiAlC, Al, TiAl, TaN, TaAlC, TiN, TiC and Co is used as the work function adjustment layer.

The gate dielectric layer 42 includes one or more high-k dielectric layers (e.g., having a dielectric constant greater than 3.9). For example, the one or more gate dielectric layers may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloyed oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, SiN, $Al_2O_3$, $La_2O_3$, $Ta_2O_3$, $Y_2O_3$, $HfO_2$, $ZrO_2$, HfSiON, $YGe_xO_y$, $YSi_xO_y$ and $LaAlO_3$, and the like. The formation methods of gate dielectric layer 42 include molecular-beam deposition (MBD), ALD, PVD, and the like. In some embodiments, the gate dielectric layer 42 has a thickness of about 0.5 nm to about 5 nm.

The gate structure 40 further includes sidewall spacer layers 51, as shown in FIG. 1A. The sidewall spacer 51 includes an upper portion 56 and a lower portion 53. The lower portion further includes a first portion 52, a second portion 54 and an airgap 50 disposed between the first portion 52 and the second portion 54. The first portion 52 is disposed closer to the gate electrode 44 than the second portion 54. The upper portion 56 is approximately the upper 25% of the entire height of the sidewall spacers 51, and includes no air gap.

FIG. 1B is a mixed view of a cross sectional view cutting a gate structure in the X direction but not cutting the fin structure 20 and a side view showing a side face of the source/drain epitaxial layer 60. As shown in FIG. 1B, the semiconductor device further includes an etch-stop layer (ESL) 62. The ESL 62 covers the source/drain epitaxial layer 60 and is disposed on the isolation insulating layer 30. The ESL disposed on the side faces of the source/drain epitaxial layer 60 is omitted.

As shown in FIG. 1B, the gate structure 40 (or the height of the sidewall spacer layers 51) has height H2 measured from the upper surface of the isolation insulating layer 30. The height H1 of the uppermost portion of the air gap measured from the isolation insulating layer 30 is about 20-70% of H2, in some embodiments. In other embodiments, H1 is about 30-60% of H2. As set forth above, the upper portion 56 does not have air gap. In other words, the semiconductor device of the present disclosure generally includes an air gap in a bottom portion of the sidewall spacer.

In some embodiments, H1 is equal to or greater than a height H5 of the source/drain epitaxial layer 60. In other embodiments, H1 is smaller than H5.

FIG. 1C shows a gate structure 40 with a gate cap insulating layer 48. In this structure, the sidewall spacers 50 are disposed on sidewalls of the gate electrode layer 44 and the gate cap insulating layer 48. In such a case, the height H1 of the uppermost portion of the air gap measured from the isolation insulating layer 30 is about 20% or more of the height H3 of the gate electrode layer 44 measured from the upper surface of the isolation insulating layer 30, in some embodiments. In some embodiments, an uppermost portion of the air gap 50 is lower than an uppermost portion of the gate electrode 44, i.e., H1<H3. In certain embodiments, H1 is about 50-90% of H3.

As shown in FIG. 1D, in some embodiments, a bottom insulating layer 56 is disposed between the bottom of the air gap 50 and the isolation insulating layer 30. The thickness H4 of the bottom insulating layer 56 is in a range from about 0.5 nm to about 2.0 nm, in some embodiments. In other embodiments, the bottom of the air gap 50 is exposed (directly contacts) to the upper surface of the isolation insulating layer 30. The width W1 of the airgap (the largest width in the X direction) is in a range from about 0.5 nm to about 8.0 nm, in some embodiments. In other embodiments, W1 is in a range from about 1.0 nm to about 5.0 nm. The air gap 50 is one continuous space formed in on sidewall spacer and should be distinguished over pores in a porous material. In some embodiments, H1 is in a range from about 10 nm to about 70 nm. The aspect ratio of the air gap 50 (H1/W1) is in a range from about 2 to about 200 in some embodiments.

In some embodiments, as shown in FIG. 1C, the cross sectional shape of the air gap 50 is a thin oval.

FIGS. 2A-3F illustrate various stages of a semiconductor device fabrication process in accordance with an embodiment of the present disclosure. It is understood that additional operations can be provided before, during, and after processes shown by FIGS. 2A-3F, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-1D may be employed in the following embodiments, and detailed explanation thereof may be omitted.

Figure 2A:
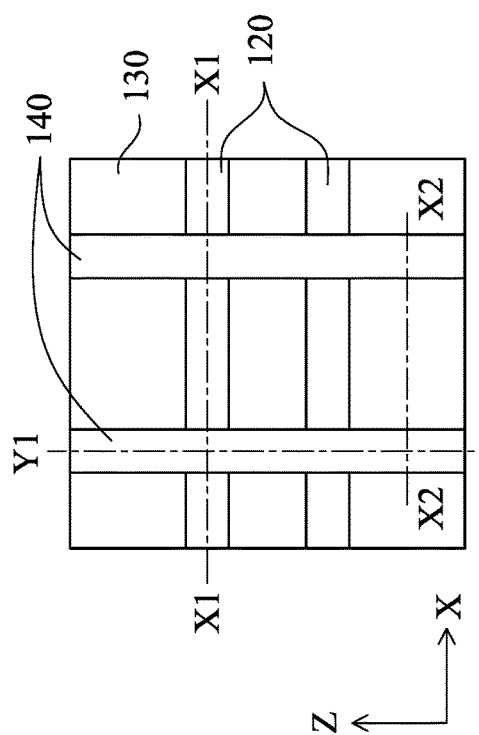
FIGS. 2A-2C illustrate various stages of a semiconductor device fabrication process in accordance with an embodiment of the present disclosure.
Figure 2B:
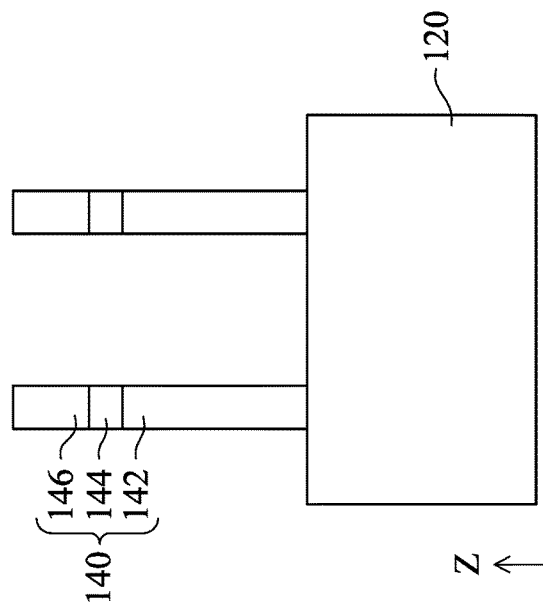
Figure 2C:
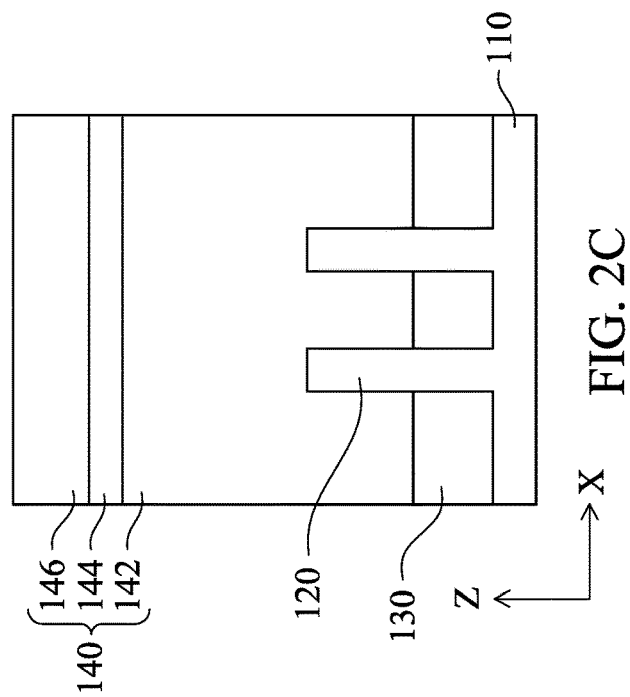

FIG. 2A shows a plan (top) view, FIG. 2B shows a cross sectional view corresponding to line X1-X1 of FIG. 2A, and FIG. 2C shows a cross sectional view corresponding to line Y1-Y1 of FIG. 2A, which illustrate a semiconductor device structure after a polysilicon gate electrode is formed over a channel layer (a fin structure). In some embodiments, the polysilicon gate electrode is a dummy gate electrode, which is subsequently replaced with a metal gate.

First, fin structures 120 are formed over a substrate 110 using, for example, a patterning process. The fin structures 120 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures.

After the fin structures are formed, an isolation insulating layer 130 (STI), is disposed over the fin structures 120 and the substrate 110. Prior to forming the isolation insulating region 130, one or more liner layers are formed over the substrate 110 and sidewalls of the bottom part of the fin structures 120, in some embodiments. In some embodiments, the liner layers include a first fin liner layer formed on the substrate 110 and sidewalls of the bottom part of the fin structures 120, and a second fin liner layer formed on the first fin liner layer. Each of the liner layers has a thickness between about 1 nm and about 20 nm in some embodiments. In some embodiments, the first fin liner layer includes silicon oxide and has a thickness between about 0.5 nm and about 5 nm, and the second fin liner layer includes silicon nitride and has a thickness between about 0.5 nm and about 5 nm. The liner layers may be deposited through one or more processes such as physical vapor deposition (PVD), chemical vapor deposition (CVD), or atomic layer deposition (ALD), although any acceptable process may be utilized.

The isolation insulating layer 130 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 130 is formed through a process such as CVD, flowable CVD (FCVD), or a spin-on-glass process, although any acceptable process may be utilized. Subsequently, portions of the isolation insulating layer 130 extending over the top surfaces of the fin structures 120, and portions of the liner layers over the top surfaces of the fin structures 120 are removed using, for example, an etch process, chemical mechanical polishing (CMP), or the like. Further, the isolation insulating layer 130 is recessed to expose the upper portion of the fin structures 120. In some embodiments, the isolation insulating layer 130 is recessed using a single etch processes, or multiple etch processes. In some embodiments in which the isolation insulating layer 130 is made of silicon oxide, the etch process may be, for example, a dry etch, a chemical etch, or a wet cleaning process. For example, the chemical etch may employ a fluorine-containing chemical such as dilute hydrofluoric (dHF) acid. Other materials, processes, and dimensions may be used.

After the fin structure 120 is formed, a dummy gate 142 including a dummy gate dielectric layer and a dummy gate electrode layer are formed over the exposed fin structure 120, which is subsequently used as a channel layer. The dummy gate dielectric layer and the dummy gate electrode layer will be subsequently used to define and form the source/drain regions. In some embodiments, the dummy gate dielectric layer and the dummy gate electrode layer are formed by depositing and patterning a dummy dielectric layer formed over the exposed fin structures 120 and a dummy electrode layer over the dummy gate dielectric layer. The dummy dielectric layer may be formed by thermal oxidation, CVD, sputtering, or any other methods known and used in the art for forming a dummy dielectric layer. In some embodiments, the dummy dielectric layer may be made of one or more suitable dielectric materials such as silicon oxide, silicon nitride, SiCN, SiON, and SiN, low-k dielectrics such as carbon doped oxides, extremely low-k dielectrics such as porous carbon doped silicon dioxide, a polymer such as polyimide, the like, or a combination thereof. In one embodiment, $SiO_2$ is used.

Subsequently, the dummy gate electrode layer is formed over the dummy gate dielectric layer. In some embodiments, the dummy gate electrode layer is a conductive material and is selected from a group comprising amorphous silicon, poly silicon, amorphous germanium, poly germanium, amorphous silicon-germanium, poly silicon-germanium, metallic nitrides, metallic silicides, metallic oxides, and metals. The dummy electrode layer may be deposited by PVD, CVD, sputter deposition, or other techniques known and used in the art for depositing conductive materials. Other materials, conductive and non-conductive, may be used. In one embodiment, polysilicon is used.

A mask pattern may be formed over the dummy gate electrode layer to aid in the patterning. The mask pattern includes a first mask layer 144 and a second mask layer 146 disposed on the first layer 144. The mask pattern includes one or more layers of $SiO_2$, SiCN, SiON, $Al_2O_3$, SiN, or other suitable materials. In some embodiments, the first mask layer 144 includes SiCN or SiOCN and the second mask layer 146 includes silicon oxide. By using the mask pattern as an etching mask, the dummy electrode layer is patterned into the dummy gate electrode 142. In some embodiments, the dummy dielectric layer is also patterned to define the dummy gate dielectric layer. Thus, dummy gate structures 140 are formed as shown in FIGS. 2A-2C. The fin structures 120 extend in the X direction and the dummy gate structures 140 extend in the Y direction substantially perpendicular to the X direction. In FIGS. 2A-2C, two fin structures and two dummy gate structures are illustrated. However, the numbers of the fin structures and the dummy gate structures are not limited to two.

FIG. 3A-3F illustrates various stages of a semiconductor device fabrication process in accordance with an embodiment of the present disclosure. FIGS. 3A-3F illustrates a mixed view of a side view from the direction of Y2 of FIG. 2A and a cross sectional view corresponding to X2-X2 of FIG. 2A. In FIGS. 3A-3F, a region pF for a p-type FinFET and a region nF for an n-type FinFET sharing the same fin structure 120 are illustrated. However, these regions are not necessarily disposed adjacent to each other. There may be additional features between the two fin structures that may or may not share a fin structure.

As shown in FIG. 3A, fin structures for a p-type FinFET and an n-type FinFET are formed. Then, a sidewall spacer layer 150 is formed over the dummy gate structures 140, the fin structure 120 and the isolation insulating layer 130, followed by forming a protective layer 160 over the sidewall spacer layer 150, as shown in FIG. 3B.

The sidewall spacer layer 150 includes one or more dielectric layers. In one embodiment, the sidewall spacer layer 150 includes three layers, having a first sub-layer 152 disposed on the dummy gate structure 140, a main layer 154 disposed one the first sub-layer 152, and a second sub-layer 156 disposed on the main layer 154, as shown in FIG. 4A. In another embodiment, the sidewall spacer layer 150 includes two layers, having a first sub-layer 152 disposed on the dummy gate structure 140 and a main layer 154 disposed one the first sub-layer 152, as shown in FIG. 5A. In other embodiments, the sidewall spacer layer 150 includes one layer, a main layer 154, as shown in FIG. 6A.

The main layer 154 is made of a different material than the first sub-layer 152 and the second sub-layer 156. In some embodiments, the main layer 154, the first sub-layer 152 and the second sub-layer 156 include silicon oxide, SiN, SiOCN, SiCN, AlO, AlCO or AlCN, or any other suitable dielectric material. In certain embodiments, the first sub-layer 152 and the second sub-layer 156 include SiOCN, and the main layer 154 includes silicon oxynitride. The thickness of the first sub-layer 152 is in a range from about 1 nm to about 5 nm, the thickness of the main layer 154 is in a range from about 2 nm to about 10 nm and the thickness of the second sub-layer 156 is in a range from about 1 nm to about 5 nm, in some embodiments. Thus, the thickness of the sidewall spacer layer 150 is in a range from about 2 nm to about 25 nm, in some embodiments. In certain embodiments, the total thickness of the sidewall spacer layer 150 is in a range from about 5 nm to about 15 nm. Each layer of the sidewall spacer layer 150 can be formed by CVD, PVD or ALD. The protective layer 160 is made of a different material than the sidewall spacer layer 150, and is made of SiN, in some embodiments.

After the protective layer 160 is formed, the p-type FET region pF is covered by a cover layer 162, as shown in FIG. 3C. The cover layer 162 is a photo resist pattern in some embodiments. Then, the protective layer 160 and the sidewall spacer layer 150 disposed over the source/drain regions of the fin structure 120, which is not covered by the dummy gate structure and cover layer 162, is removed, as shown in FIG. 3D. After that, a source/drain epitaxial layer 170 is formed over the exposed source/drain regions of the fin structure 120 after cover layer 162 is removed, as shown in FIG. 3E. After the source/drain epitaxial layer 170 for the p-type FinFET is formed, the protective layer 160 in the n-type region are removed, as shown in FIG. 3F. In some embodiments, an n-type source/drain epitaxial layer is also formed for the n-type FinFET, while the p-type region is covered by the cover layer(s) as described above.

The materials used for the source/drain epitaxial layer 170 may be varied for the n-type and p-type FinFETs, such that one type of material is used for the n-type FinFETs to exert a tensile stress in the channel region and another type of material for the p-type FinFETs to exert a compressive stress. For example, SiP or SiC may be used to form n-type FinFETs, and SiGe or Ge may be used to form p-type FinFETs. Other materials may be used. In some embodiments, the source/drain epitaxial layer 170 includes two or more epitaxial layers with different compositions and/or different dopant concentrations.

FIGS. 4A-4H illustrate various stages of a semiconductor device fabrication process in accordance with an embodiment of the present disclosure. It is understood that additional operations can be provided before, during, and after the processes shown by FIGS. 4A-4H, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-3F may be employed in the following embodiments, and detailed explanation thereof may be omitted.

FIGS. 4A-4H show an embodiment, in which a three-layer sidewall spacer layer is employed. In FIGS. 4A-4H, three dummy gate structures and two source/drain epitaxial layers 170 are illustrated, but the configuration is not limited thereto. FIGS. 4A-4H illustrate a mixed view of a side view and a cross sectional view, similar to FIGS. 3A-3F.

After the source/drain epitaxial layer 170 is formed, an etching operation is performed to remove protective layer 160, as shown in FIG. 4A.

Then, a contact etch stop layer (CESL) 180 is conformally formed over the dummy gate structures, as shown in FIG. 4B. In some embodiments, the CESL 180 includes SiN, SiOCN, SiOC or silicon oxide, formed by CVD and/or ALD. In some embodiments, SiN is used as the CESL 180. The CESL 180 is also formed over the source/drain epitaxial layer 170 and the isolation insulating layer 130. The thickness of the CESL 180 is in a range from about 1 nm to about 5 nm in some embodiments.

Subsequently, a sacrificial layer 185 is formed over the dummy gate structures. Then, a planarization operation, such as an etch-back process or a CMP process, is performed until the mask layer 144 is exposed, as shown in FIG. 4C. The sacrificial layer 185 includes amorphous silicon, amorphous germanium, amorphous carbon, or a dielectric material, such as silicon oxide. A low-k material or spin-on-glass (SOG) is used as the sacrificial layer 185 in some embodiments.

The sacrificial layer 185 is then recessed, by a suitable etching process, to expose the upper portion of the dummy gate structures, as shown in FIG. 4D. In some embodiments, the sacrificial layer 185 is not recessed enough to expose the CESL 180 on the source/drain epitaxial layer 170.

Figure 4E:
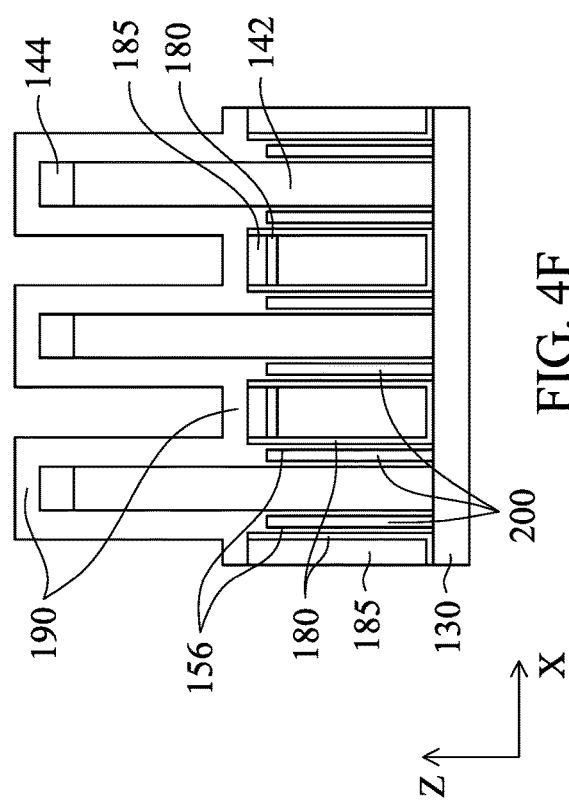
FIG. 4E illustrates one of the various stages of a semiconductor device fabrication process in accordance with an embodiment of the present disclosure.

Next, as shown in FIG. 4E, the CESL 180 and the second sub-layers 156 and the main layers 154 of the sidewall spacer 150 disposed on the exposed upper portions of the dummy gate structures are removed by one or more suitable etching operations. Further, the main layers 154 disposed on the bottom portion of the dummy gate structures are also removed. Since the main layer 154 is made of a different material (e.g., silicon oxynitride) than the first and second sub-layers 152 and 156 (e.g., SiOCN), the main layer 154 can be selectively removed from the sidewall spacer 150. By removing the main layer 154, a space 155 is formed between the first sub-layer 152 and the second sub-layer 156 at the bottom portion of the dummy gate structure. Since the space 155 is formed at only the bottom portion of the dummy gate structure, the main layer 154 can be more easily and completely removed compared with the case in which a space (or an air gap) is formed at substantially the entire side face of the dummy gate structure.

Figure 4F:
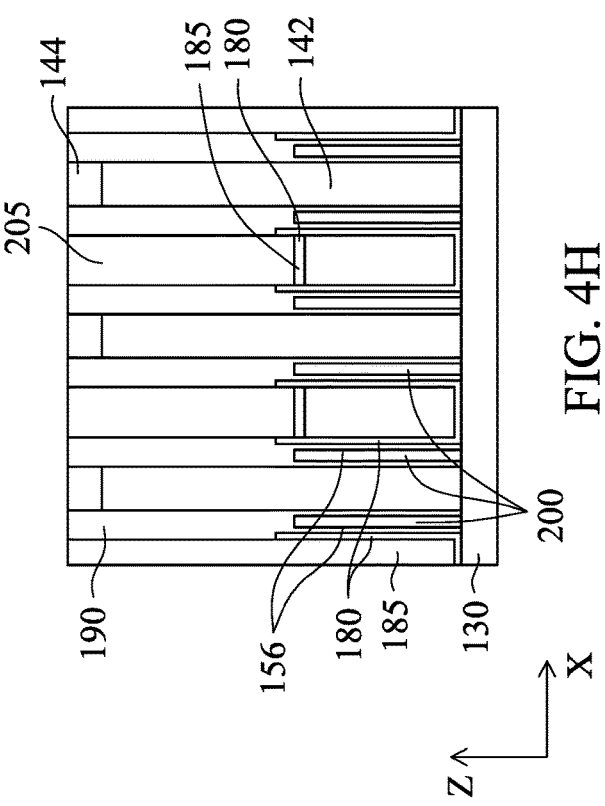
FIG. 4F illustrates one of the various stages of a semiconductor device fabrication process in accordance with an embodiment of the present disclosure.

After the spaces 155 are formed, the spaces 155 are sealed by forming an upper sidewall spacer layer 190, as shown in FIG. 4F. The upper sidewall spacer layer 190 includes SiCN, SiOCN or SiOC, and can be formed by ALD and/or CVD. In some embodiments, the upper sidewall spacer layer 190 is made of the same material as the first and second sub-layers 152 and 156. By forming the upper sidewall spacer layer 190, air gaps 200 are formed as shown in FIG. 4F. In certain embodiments, before the upper sidewall spacer layer 190 is formed, a thin liner layer is conformally formed inside the spaces 155. The material of the thin layer can be the same as that of the upper sidewall spacer layer 190. By adjusting deposition condition, it is possible to fill the upper opening of the spaces 155 faster than forming a layer in the spaces 155.

Figure 4G:
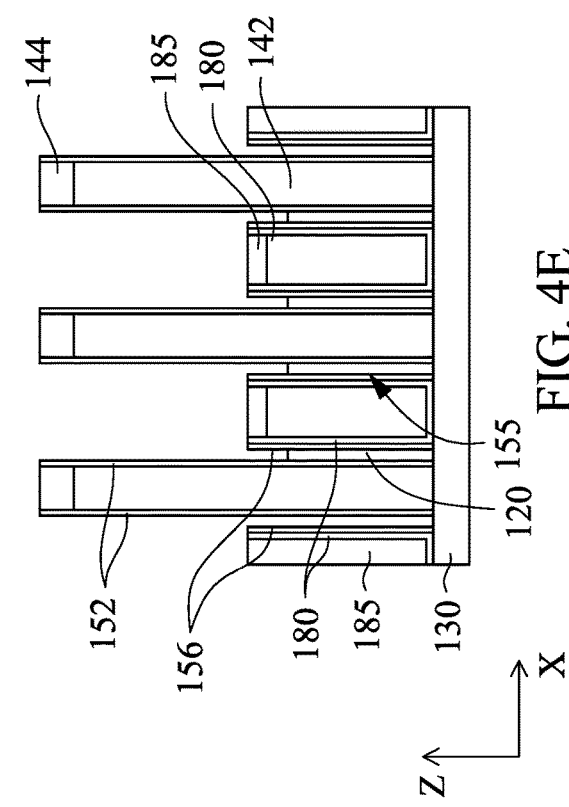
FIG. 4G illustrates one of the various stages of a semiconductor device fabrication process in accordance with an embodiment of the present disclosure.
Figure 4H:
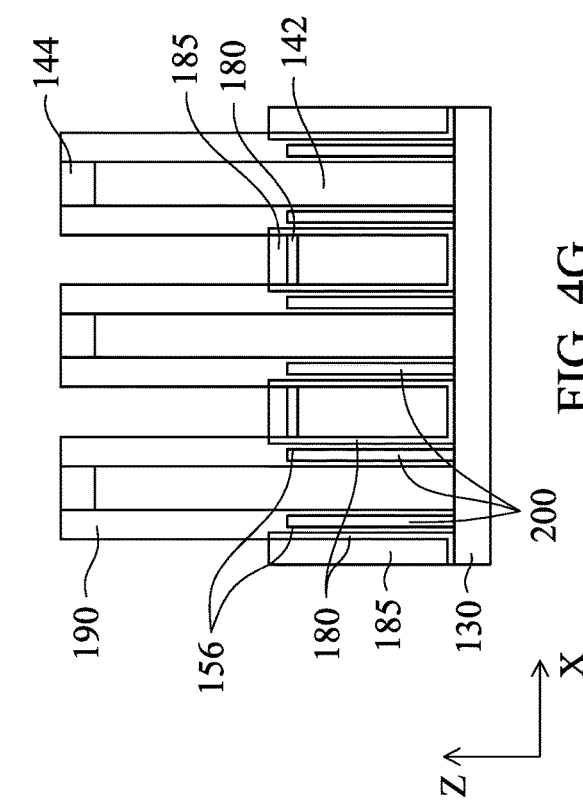
FIG. 4H illustrates one of the various stages of a semiconductor device fabrication process in accordance with an embodiment of the present disclosure.

After the air gaps 200 are formed, anisotropic etching is performed to form upper sidewall spacers 190, as shown in FIG. 4G. Subsequently, the sacrificial layer is removed and then an interlayer dielectric (ILD) layer 205 is formed, as shown in FIG. 4H. The ILD layer 205 includes silicon oxide, SiCN, SiOC, SiCN, or any suitable dielectric material.

FIGS. 5A-5H illustrate various stages of a semiconductor device fabrication process in accordance with another embodiment of the present disclosure. It is understood that additional operations can be provided before, during, and after processes shown by FIGS. 5A-5H, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-4H may be employed in the following embodiments, and detailed explanation thereof may be omitted.

FIGS. 5A-5H show an embodiment, in which a two-layer sidewall spacer layer is employed. In FIGS. 5A-5H, three dummy gate structures and two source/drain epitaxial layers 170 are illustrated, but the configuration is not limited thereto. FIGS. 5A-5H illustrate a mixed view of a side view and a cross sectional view, similar to FIGS. 3A-4H.

After the source/drain epitaxial layer 170 is formed, an etching operation is performed to remove protective layer 160, as shown in FIG. 5A.

Then, a contact etch stop layer (CESL) 180 is conformally formed over the dummy gate structures, as shown in FIG. 5B. In some embodiments, the CESL 180 includes SiN, SiOCN, SiOC or silicon oxide, formed by CVD and/or ALD. In some embodiments, SiN is used as the CESL 180. The CESL 180 is also formed over the source/drain epitaxial layer 170 and the isolation insulating layer 130.

Subsequently, a sacrificial layer 185 is formed over the dummy gate structures. Then, a planarization operation, such as an etch-back process or a CMP process, is performed until the first mask layer 144 is exposed, as shown in FIG. 5C. The sacrificial layer 185 includes amorphous silicon, amorphous germanium, amorphous carbon, or a dielectric material, such as silicon oxide. A low-k material or spin-on-glass (SOG) may be used as the sacrificial layer 185.

The sacrificial layer 185 is then recessed, by a suitable etching process, to expose the upper portion of the dummy gate structures, as shown in FIG. 5D. In some embodiments, the sacrificial layer 185 is not recessed enough to expose the CESL 180 on the source/drain epitaxial layer 170.

Figure 5E:
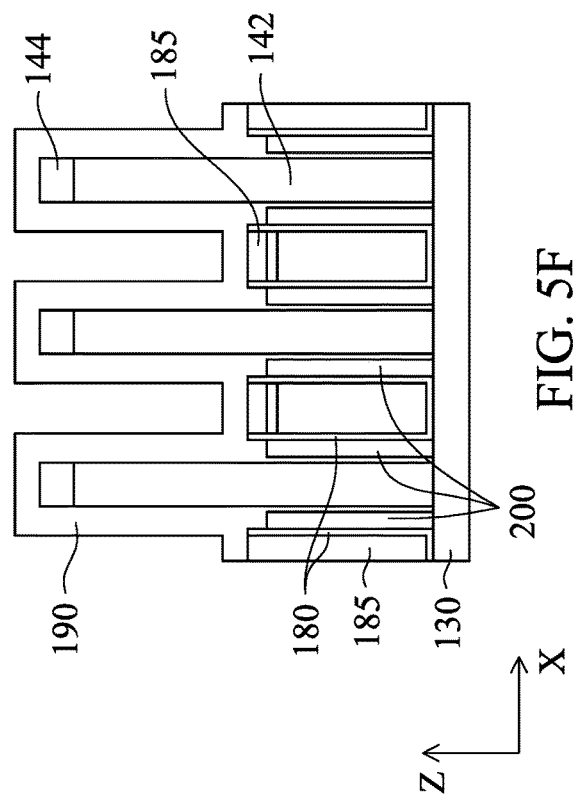
FIG. 5E illustrates one of the various stages of a semiconductor device fabrication process in accordance with another embodiment of the present disclosure.

Next, as shown in FIG. 5E, the CESL 180 and the main layers 154 of the sidewall spacer 150 disposed on the exposed upper portions of the dummy gate structures are removed by one or more suitable etching operations. Further, the main layers 154 disposed on the bottom portion of the dummy gate structures are also removed. Since the main layer 154 is made of a different material (e.g., silicon oxynitride) than the first sub-layer 152 (e.g., SiOCN) and the CESL 180 (e.g., SiN), the main layer 154 can be selectively removed from the sidewall spacer 150. By removing the main layer 154, a space 155 is formed between the first sub-layer 152 and the CESL 180 at the bottom portion of the dummy gate structure.

Figure 5F:
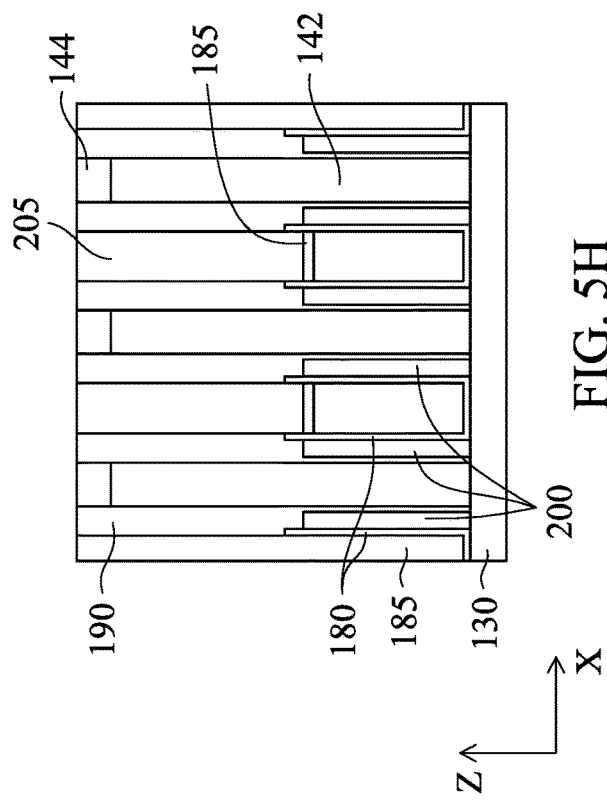
FIG. 5F illustrates one of the various stages of a semiconductor device fabrication process in accordance with another embodiment of the present disclosure.

After the spaces 155 are formed, the spaces 155 are sealed by forming an upper sidewall spacer layer 190, as shown in FIG. 5F. The upper sidewall spacer layer 190 includes SiCN, SiOCN or SiOC, and can be formed by ALD and/or CVD. In some embodiments, the upper sidewall spacer layer 190 is made of the same material as the first and second sub-layers 152 and 156. By forming the upper sidewall spacer layer 190, air gaps 200 are formed as shown in FIG. 5F. In certain embodiments, before the upper sidewall spacer layer 190 is formed, a thin liner layer is conformally formed inside the spaces 155. The material of the thin layer can be the same as that of the upper sidewall spacer layer 190.

Figure 5G:
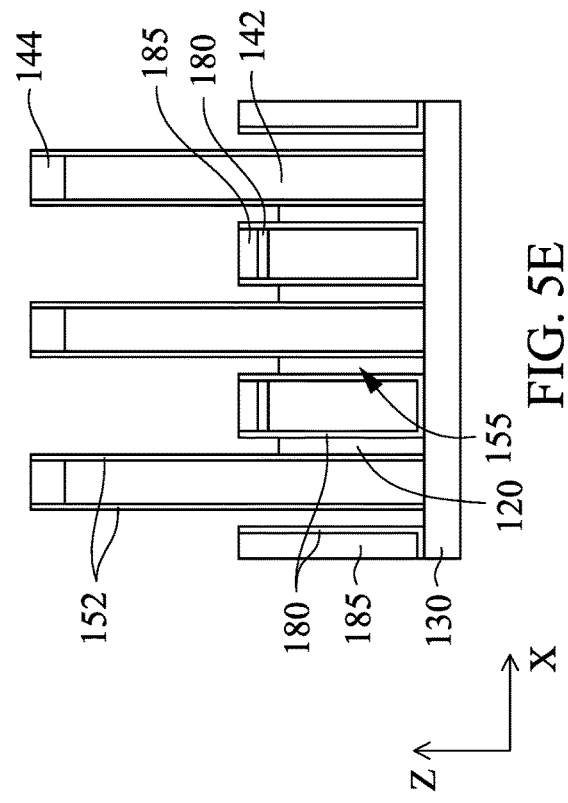
FIG. 5G illustrates one of the various stages of a semiconductor device fabrication process in accordance with another embodiment of the present disclosure.
Figure 5H:
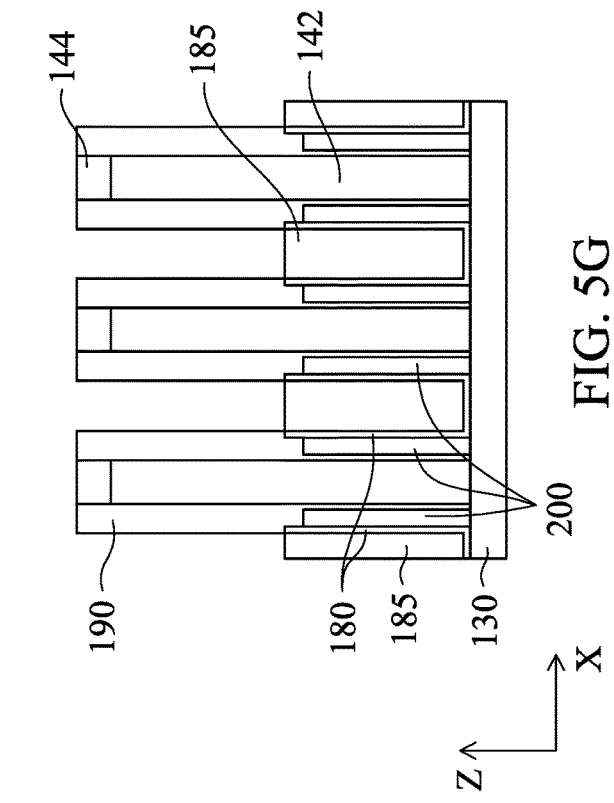
FIG. 5H illustrates one of the various stages of a semiconductor device fabrication process in accordance with another embodiment of the present disclosure.

After the air gaps 200 are formed, anisotropic etching is performed to form upper sidewall spacers 190, as shown in FIG. 5G. Subsequently, the sacrificial layer is removed and then an interlayer dielectric (ILD) layer 205 is formed, as shown in FIG. 5H. The ILD layer 205 includes silicon oxide, SiOC, SiCN, or any suitable dielectric material.

FIGS. 6A-6H illustrate various stages of a semiconductor device fabrication process in accordance with another embodiment of the present disclosure. It is understood that additional operations can be provided before, during, and after processes shown by FIGS. 6A-6H, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-5H may be employed in the following embodiments, and detailed explanation thereof may be omitted.

FIGS. 6A-6I show an embodiment, in which a one-layer sidewall spacer layer is employed. In FIGS. 6A-6I, three dummy gate structures and two source/drain epitaxial layers 170 are illustrated, but the configuration is not limited thereto. FIGS. 6A-6I illustrates a mixed view of a side view and a cross sectional view, similar to FIGS. 3A-5H.

After the source/drain epitaxial layer 170 is formed, an etching operation is performed to remove protective layer 160, as shown in FIG. 6A.

Then, a contact etch stop layer (CESL) 180 is conformally formed over the dummy gate structures, as shown in FIG. 6B. In some embodiments, the CESL 180 includes SiN, SiOCN, SiOC or silicon oxide, formed by CVD and/or ALD. In some embodiments, SiN is used as the CESL 180. The CESL 180 is also formed over the source/drain epitaxial layer 170 and the isolation insulating layer 130.

Subsequently, a sacrificial layer 185 is formed over the dummy gate structures. Then, a planarization operation, such as an etch-back process or a CMP process, is performed until the first mask layer 144 is exposed, as shown in FIG. 6C. The sacrificial layer 185 includes amorphous silicon, amorphous germanium, amorphous carbon, or a dielectric material, such as silicon oxide. A low-k material or spin-on-glass (SOG) may be used as the sacrificial layer 185.

The sacrificial layer 185 is then recessed, by a suitable etching process, to expose the upper portion of the dummy gate structures, as shown in FIG. 6D. In some embodiments, the sacrificial layer 185 is not recessed enough to expose the CESL 180 on the source/drain epitaxial layer 170.

Figure 6E:
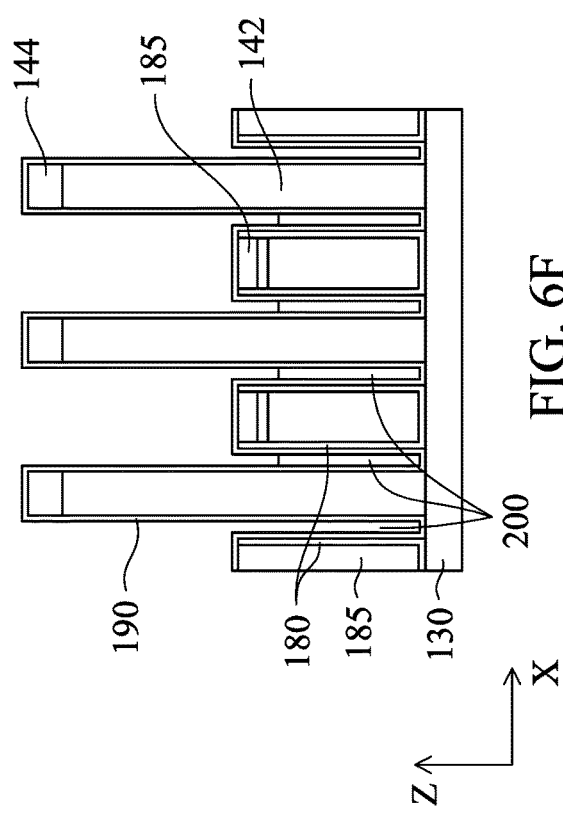
FIG. 6E illustrates one of the various stages of a semiconductor device fabrication process in accordance with another embodiment of the present disclosure.

Next, as shown in FIG. 6E, the CESL 180 and the main layers 154 of the sidewall spacer 150 disposed on the exposed upper portions of the dummy gate structures are removed by one or more suitable etching operations. Further, the main layers 154 disposed on the bottom portion of the dummy gate structures are also removed. Since the main layer 154 is made of a different material (e.g., silicon oxynitride) than the CESL 180 (e.g., SiN), the main layer 154 can be selectively removed. By removing the main layer 154, a space 155 is formed between the dummy gate electrode 142 and the CESL 180 at the bottom portion of the dummy gate structure.

Figure 6F:
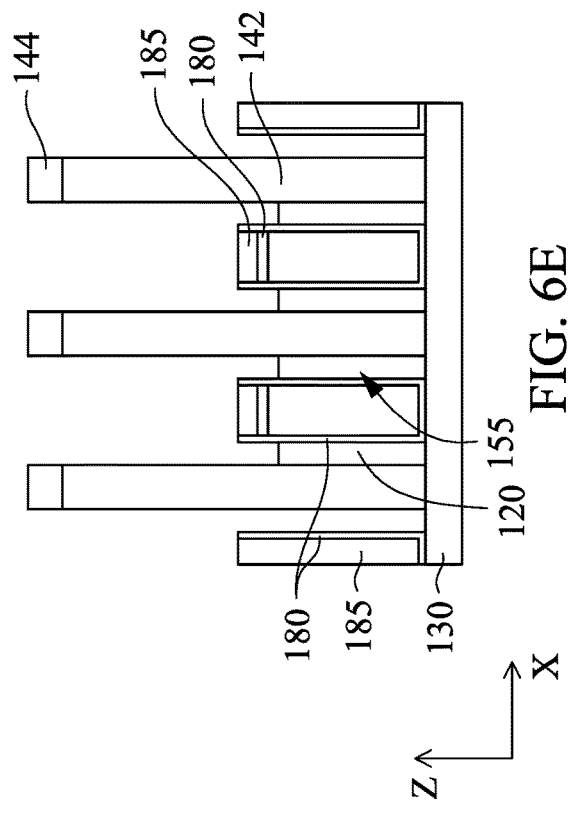
FIG. 6F illustrates one of the various stages of a semiconductor device fabrication process in accordance with another embodiment of the present disclosure.

In some embodiments, a thin liner layer 192 is conformally formed inside the spaces 155 and the upper portion of the dummy gate structures, as shown in FIG. 6F. The material of the thin liner layer 192 can be SiOCN or SiOC, and formed by ALD and/or CVD. The thickness of the thin liner layer 192 is in a range from about 1 nm to about 5 nm, in some embodiments.

Figure 6G:
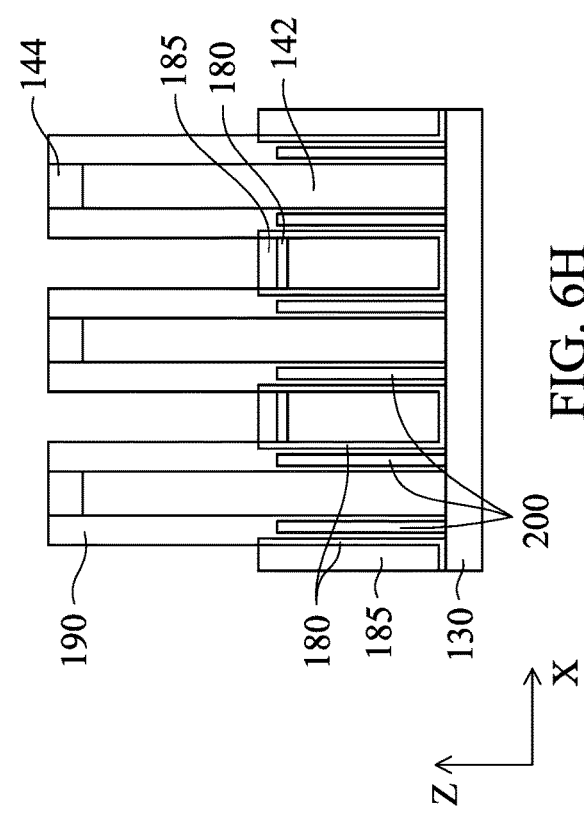
FIG. 6G illustrates one of the various stages of a semiconductor device fabrication process in accordance with another embodiment of the present disclosure.

Then, the spaces 155 are sealed by forming an upper sidewall spacer layer 190, as shown in FIG. 6G. The upper sidewall spacer layer 190 includes SiCN, SiOCN or SiOC, and can be formed by ALD and/or CVD. In some embodiments, the upper sidewall spacer layer 190 is made of the same material as the thin liner layer 192. By forming the upper sidewall spacer layer 190, air gaps 200 are formed as shown in FIG. 6G.

Figure 6H:
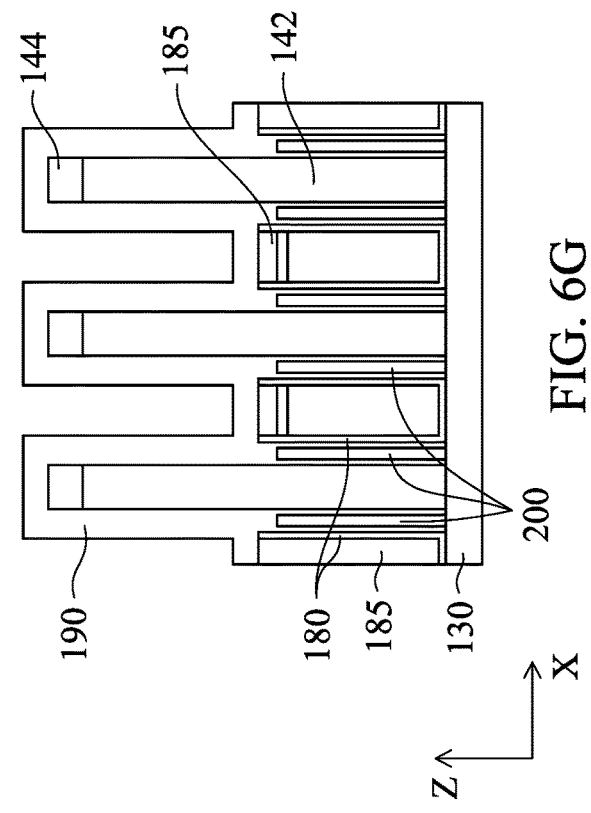
FIG. 6H illustrates one of the various stages of a semiconductor device fabrication process in accordance with another embodiment of the present disclosure.
Figure 6I:
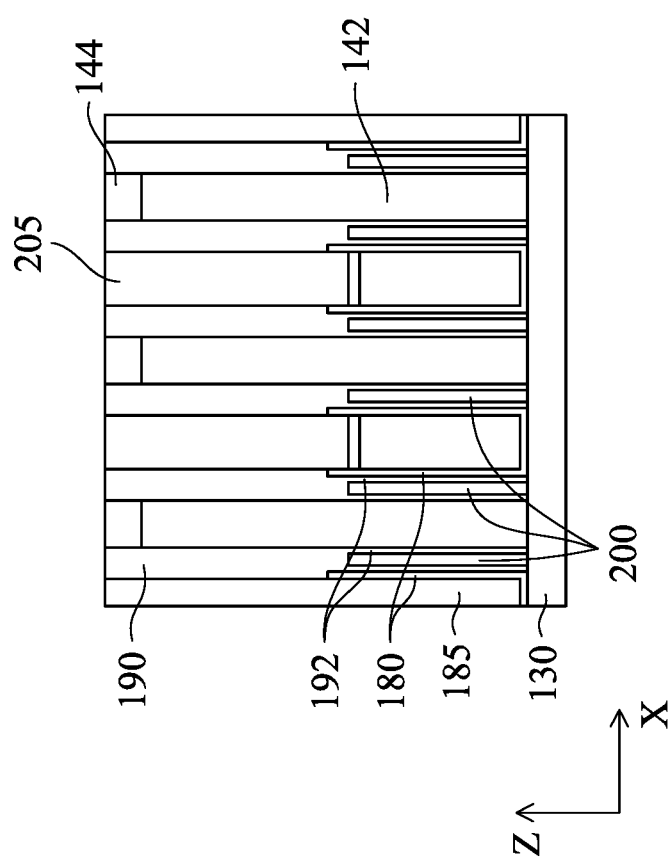
FIG. 6I illustrates one of the various stages of a semiconductor device fabrication process in accordance with another embodiment of the present disclosure.

After the air gaps 200 are formed, anisotropic etching is performed to form upper sidewall spacers 190, as shown in FIG. 6H. Subsequently, the sacrificial layer is removed and then an interlayer dielectric (ILD) layer 205 is formed, as shown in FIG. 6I. The ILD layer 205 includes silicon oxide, SiOC, SiCN, or any suitable dielectric material.

FIGS. 7A-7D illustrate various stages of a semiconductor device fabrication process in accordance with an embodiment of the present disclosure. It is understood that additional operations can be provided before, during, and after processes shown by FIGS. 7A-7D, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-6I may be employed in the following embodiments, and detailed explanation thereof may be omitted.

FIGS. 7A-7D show various stages of forming a metal gate structure by utilizing a gate replacement technology. FIGS. 7A-7D illustrate a mixed view of a side view and a cross sectional view, similar to FIGS. 3A-6I.

After the structure as shown by FIG. 4H, FIG. 5H or FIG. 6I is formed, a planarization operation, such as CMP, is performed to remove the first mask layer 144, as shown in FIG. 7A. FIG. 7A shows the case in which the sidewall spacer layer 150 includes three layers. However, the gate replacement technology describe below is substantially the same for the other cases (two-layer or one-layer sidewall spacer layer), and the metal gate formation operations are explained by using the three-layer case.

Then, the dummy gate 142 (dummy gate electrode and dummy gate dielectric layer) is removed, thereby forming gate spaces 149, as shown in FIG. 7B. The removal process may include one or more etch processes. For example in some embodiments, the removal process includes selective etching using either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH$: $H_2O_2$:$H_2O$ (APM), $NH_2OH$, KOH, $HNO_3$:$NH_4F$:$H_2O$, and/ or the like. The dummy gate dielectric layer may be removed using a wet etch process, such as a diluted HF acid, may be used. Other processes and materials may be used.

Then, a gate dielectric layer 225 and metal gate electrode 220 are formed in the gate spaces, as shown in FIG. 7C. The formation methods of gate dielectric layer 225 include molecular-beam deposition (MBD), ALD, PVD, and the like. In some embodiments, an interfacial layer (not shown) may be formed prior to forming the gate dielectric layer 225, and the gate dielectric layer 225 is formed over the interfacial layer. The interfacial layer helps buffer the subsequently formed high-k dielectric layer from the underlying semiconductor material. In some embodiments, the interfacial layer is a chemical silicon oxide, which may be formed by chemical reactions. For example, a chemical silicon oxide may be formed using deionized water+ozone ($DIO_3$), $NH_4OH$+$H_2O_2$+$H_2O$ (APM), or other methods. Other embodiments may utilize a different material or processes for the interfacial layer. In an embodiment, the interfacial layer has a thickness of about 0.2 nm to about 1 nm. The gate electrode layer 220 may be formed using a suitable process such as ALD, CVD, PVD, plating, or combinations thereof. A planarization process, such as a CMP, may be performed to remove excess materials.

In some embodiments, gate cap insulating layers 230 are formed as shown in FIG. 7D. The metal gate electrode 220 and the gate dielectric layer 225 are recessed, and then an insulating material layer is formed. A planarization process, such as a CMP, is performed to remove excess insulating material. In some embodiments, the gate cap insulating layer includes $SiO_2$, SiCN, SiON, SiN, $Al_2O_3$, $La_2O_3$, a combination thereof, or the like, but other suitable dielectric films may be used.

After forming the metal gate structures, further CMOS processes are performed to form various features such as additional interlayer dielectric layers, contacts/vias, interconnect metal layers, and passivation layers, etc.

FIGS. 8A-8D illustrate various stages of a semiconductor device fabrication process in accordance with an embodiment of the present disclosure. It is understood that additional operations can be provided before, during, and after the processes shown by FIGS. 8A-8D, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-7D may be employed in the following embodiments, and detailed explanation thereof may be omitted. FIGS. 8A-8D illustrate a mixed view of a side view and a cross sectional view, similar to FIGS. 3A-7D.

In the foregoing embodiments, the air gaps are formed before the metal gate structure (gate replacement process) is formed. In the following embodiments, the air gaps are formed after the metal gate structure is formed.

Figure 8A:
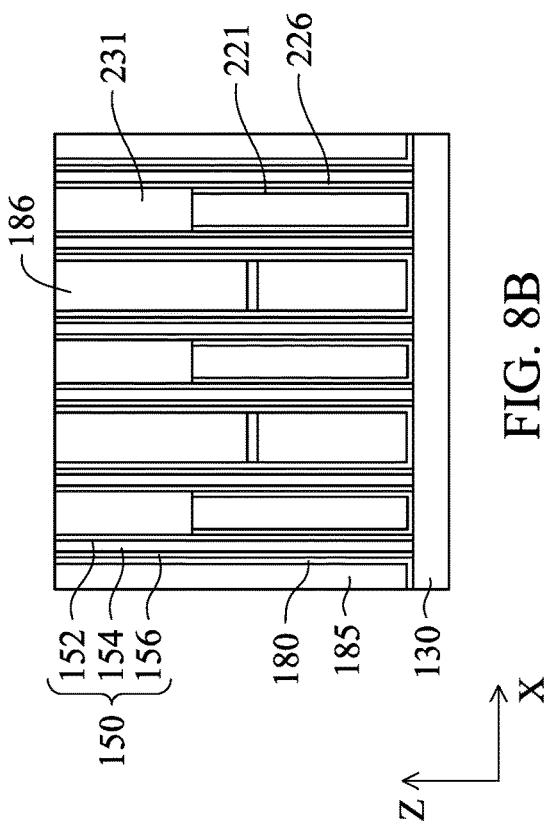
FIG. 8A illustrates one of the various stages of a semiconductor device fabrication process in accordance with another embodiment of the present disclosure.

After the structure of FIG. 4B (or FIG. 5B or 6B) is formed, an interlayer dielectric layer 186 is formed and a planarization operation, such as CMP, is performed to expose the upper surface of the dummy gate 142, as shown in FIG. 8A. In some embodiments, the ILD layer 186 can be a sacrificial layer similar to the sacrificial layer 185. FIG. 8A shows the case in which the sidewall spacer layer 150 includes three layers. However, the operations described below are substantially the same for the other cases (two-layer or one-layer sidewall spacer layer), and the air gap formation operations are explained by using the three-layer case.

Figure 8B:
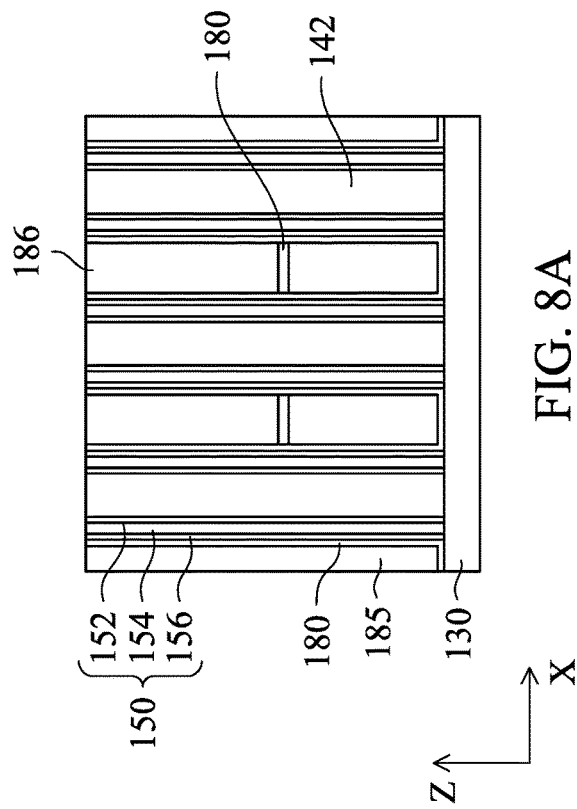
FIG. 8B illustrates one of the various stages of a semiconductor device fabrication process in accordance with another embodiment of the present disclosure.

Then, the dummy gate 142 is removed similar to FIG. 7B, and similar to FIG. 7D, a metal gate structure having a gate dielectric layer 226, a metal gate 221 and a gate cap insulating layer 231 is formed, as shown in FIG. 8B.

Figure 8C:
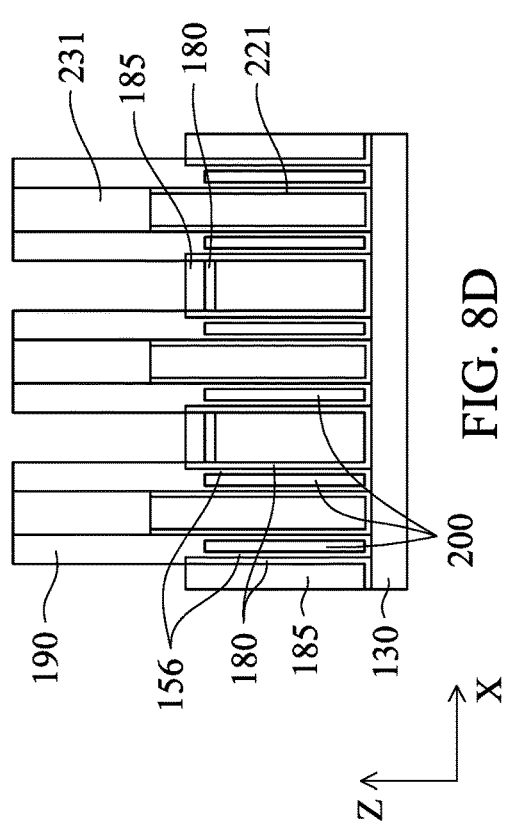
FIG. 8C illustrates one of the various stages of a semiconductor device fabrication process in accordance with another embodiment of the present disclosure.

Next, as shown in FIG. 8C, the CESL 180 and the second sub-layers 156 and the main layers 154 of the sidewall spacer 150 disposed on the exposed upper portions of the gate structures are removed by one or more suitable etching operations, similar to FIG. 4E. Further, the main layers 154 disposed on the bottom portion of the dummy gate structures are also removed. By removing the main layer 154, a space 155 is formed between the first sub-layer 152 and the second sub-layer 156 at the bottom portion of the dummy gate structure.

Figure 8D:
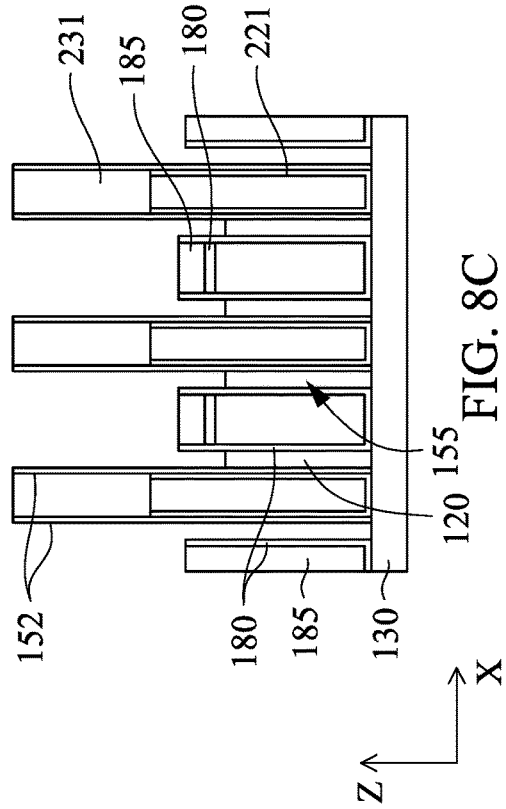
FIG. 8D illustrates one of the various stages of a semiconductor device fabrication process in accordance with another embodiment of the present disclosure.

Then, by the operations similar to FIGS. 4F and 4G, the air gaps 200 and the upper sidewall spacers 190 are formed, as shown in FIG. 8D. If the layer 185 is an ILD layer, an additional ILD layer is subsequently formed on the ILD layer 185. If the layer 185 is a sacrificial layer, the sacrificial layer 185 is removed and a new ILD layer is formed.

After forming the air gaps, further CMOS processes are performed to form various features such as additional interlayer dielectric layers, contacts/vias, interconnect metal layers, and passivation layers, etc.

It will be understood that not all advantages have been necessarily discussed herein, no particular advantage is required for all embodiments or examples, and other embodiments or examples may offer different advantages.

For example, in the present disclosure, air gaps are formed in the sidewall spacer layers at the bottom portion of the gate electrode, an effective dielectric constant of the sidewall spacers can be reduced, which can reduce parasitic capacitance. Thus, a high frequency performance of the semiconductor device can be improved. Further, the air gap is disposed only at the bottom portion of the gate electrode and the upper portions of the sidewall spacers do not include an air gap. Accordingly, when a contact is formed on the gate electrode and/or the source/drain epitaxial layer, even if a misalignment between the contact and the gate electrode and/or the source/drain epitaxial layer occurs, the material of the contact does not penetrate into the air gap.

In accordance with an aspect of the present disclosure, in a method for manufacturing a semiconductor device, a gate structure is formed over a channel layer and an isolation insulating layer. A first sidewall spacer layer is formed on a side surface of the gate structure. A sacrificial layer is formed so that an upper portion of the gate structure with the first sidewall spacer layer is exposed from the sacrificial layer and a bottom portion of the gate structure with the first sidewall spacer layer is embedded in the first sacrificial layer. A space is formed between the bottom portion of the gate structure and the sacrificial layer by removing at least part of the first sidewall spacer layer. After the first sidewall spacer layer is removed, an air gap is formed between the bottom portion of the gate structure and the sacrificial layer by forming a second sidewall spacer layer over the gate structure. In one or more foregoing or following embodiments, no air gap is formed on a side surface of the upper portion of the gate structure. In one or more foregoing or following embodiments, a liner layer is further formed over the first sidewall spacer layer, before the sacrificial layer is formed. The space is formed between the liner layer and the bottom portion of the gate structure. In one or more foregoing or following embodiments, after the air gap is formed, the sacrificial layer is removed and an interlayer dielectric layer is formed. In one or more foregoing or following embodiments, the sacrificial layer includes at least one selected from the group consisting of amorphous silicon, amorphous carbon and amorphous germanium. In one or more foregoing or following embodiments, before the second sidewall spacer layer is formed, a sidewall liner layer is formed at least in the space so as not to completely fill the space. In one or more foregoing or following embodiments, the first sidewall spacer layer includes SiOCN.

In accordance with another aspect of the present disclosure, in a method for manufacturing a semiconductor device, a gate structure is formed over a channel layer of a fin structure and an isolation insulating layer. A first sidewall spacer layer is formed on a side surface of the gate structure, the first sidewall spacer layer including a main layer. A liner layer is formed over the first sidewall spacer layer. A sacrificial layer is formed so that an upper portion of the gate structure with the first sidewall spacer layer and the liner layer is exposed from the sacrificial layer and a bottom portion of the gate structure with the first sidewall spacer layer and the liner layer is embedded in the first sacrificial layer. A space is formed between the bottom portion of the gate structure and the liner layer by removing the main layer of the first sidewall spacer layer. After the first sidewall spacer layer is removed, an air gap is formed between the bottom portion of the gate structure and the liner layer by forming a second sidewall spacer layer. In one or more foregoing or following embodiments, the sacrificial layer is formed so that the fin structure is also embedded in the sacrificial layer. In one or more foregoing or following embodiments, the first sidewall spacer layer further includes one or more sub-layers, each of which is made of different material than the main layer, one of the one or more sub-layers is formed on the side surface of the gate structure, and the space is formed between the one of the one or more sub-layers disposed on the bottom portion of the gate structure and the liner layer. In one or more foregoing or following embodiments, the main layer is thicker or thinner than each of the one or more sub-layers. In one or more foregoing or following embodiments, the main layer is made of one selected from the group consisting of silicon oxide, silicon nitride, SiOCN and an insulating metal oxide. In one or more foregoing or following embodiments, the one or more sub-layers are made of SiOCN. In one or more foregoing or following embodiments, the first sidewall spacer layer further includes a first sub-layer disposed on the gate structure and a second sub-layer, each which is made of different material than the main layer, the main layer is disposed between the first and second sub-layers, and the space is formed between the first sub-layer disposed on the bottom portion of the gate structure and the liner layer. In one or more foregoing or following embodiments, the first sidewall spacer layer consists of the main layer. In one or more foregoing or following embodiments, before the second sidewall spacer layer is formed, a sidewall liner layer is further formed at least in the space so as not to completely fill the space. In one or more foregoing or following embodiments, when forming the space, an upper portion of the liner layer exposed from the sacrificial layer is also removed. In one or more foregoing or following embodiments, the gate structure is a dummy gate structure, and the method further includes, after the air gap is formed, forming an interlayer dielectric layer, removing the dummy gate structure, thereby forming a gate space, and forming a metal gate structure in the gate space. In one or more foregoing or following embodiments, before forming the interlayer dielectric layer, the sacrificial layer is removed.

In accordance with another aspect of the present disclosure, in a method for manufacturing a semiconductor device, a gate structure is formed over a channel layer of a fin structure and an isolation insulating layer. A source epitaxial layer and a drain epitaxial layer are formed over the fin structure not covered by the gate structure. A first sidewall spacer layer is formed on a side surface of the gate structure. A sacrificial layer is formed so that an upper portion of the gate structure with the first sidewall spacer layer is exposed from the sacrificial layer and a bottom portion of the gate structure with the first sidewall spacer layer and the source and drain epitaxial layers are embedded in the first sacrificial layer. A space is formed between the bottom portion of the gate structure and the sacrificial layer by removing at least part of the first sidewall spacer layer, such that a part of an upper surface of the isolation insulating layer is exposed to the space. After the first sidewall spacer layer is removed, an air gap is formed between the bottom portion of the gate structure and the sacrificial layer by forming a second sidewall spacer layer over the gate structure.

In accordance with one aspect of the present disclosure, a semiconductor device includes a gate electrode disposed over a channel layer and an isolation insulating layer, and sidewall spacer layers disposed on opposing main side surfaces of the gate electrode and over the isolation insulating layer. The sidewall spacer layers include a lower layer and an upper layer disposed on the lower layer, and the lower layer includes an air gap. In one or more foregoing or following embodiments, the upper layer includes no air gap. In one or more foregoing or following embodiments, an uppermost portion of the air gap from the isolation insulating layer is 20-70% of a height of the sidewall spacer layers. In one or more foregoing or following embodiments, an uppermost portion of the air gap from the isolation insulating layer is 20-90% of a height of the gate electrode. In one or more foregoing or following embodiments, the sidewall spacers are made of SiOCN. In one or more foregoing or following embodiments, an insulating layer is disposed between a bottom of the air gap and the isolation insulating layer. In one or more foregoing or following embodiments, a thickness of the insulating layer is in a range from 0.5 nm to 2.0 nm. In one or more foregoing or following embodiments, the upper layer is made of different material than the lower layer. In one or more foregoing or following embodiments, a width of the air gap is in a range from 0.5 nm to 8.0 nm. In one or more foregoing or following embodiments, the semiconductor device further includes a liner layer disposed on the lower layer. In one or more foregoing or following embodiments, the liner layer is made of different material than the lower layer.

In accordance with another aspect of the present application, a semiconductor device includes a gate structure disposed over a channel layer and an isolation insulating layer and having a gate electrode layer and an insulating cap layer, and sidewall spacer layers disposed on opposing main side surfaces of the gate structure and over the isolation insulating layer. The sidewall spacer layers include a lower layer and an upper layer disposed on the lower layer, and the lower layer includes an air gap. In one or more foregoing or following embodiments, the upper layer includes no air gap. In one or more foregoing or following embodiments, an uppermost portion of the air gap from the isolation insulating layer is 20-70% of a height of the sidewall spacer layers. In one or more foregoing or following embodiments, an uppermost portion of the air gap is lower than an uppermost portion of the gate electrode. In one or more foregoing or following embodiments, the semiconductor device further includes a source epitaxial layer and a drain epitaxial layer, and an uppermost portion of the air gap is equal to or higher than an uppermost portion of the source or drain epitaxial layers. In one or more foregoing or following embodiments, an uppermost portion of the air gap from the isolation insulating layer is 50-90% of a height of the gate electrode. In one or more foregoing or following embodiments, the sidewall spacers are made of SiOCN. In one or more foregoing or following embodiments, a width of the air gap is in a range from about 0.5 nm to about 8.0 nm.

In accordance with another aspect of the present disclosure, a semiconductor device includes a gate structure disposed over one or more fin structures and an isolation insulating layer in which bottom part of the one or more fin structures are embedded, and sidewall spacer layers disposed on opposing main side surfaces of the gate structure and over the isolation insulating layer. The sidewall spacer layers include air gaps at a bottom part of the gate structure.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a fin structure disposed over a substrate;
an isolation insulating layer, from which an upper portion of the fin structure protrude, and in which a lower portion of the fin structure is embedded;
a gate structure disposed over the upper portion of the fin structure;
sidewall spacers disposed on opposing side surfaces of the gate structure; and
a source/drain epitaxial layer, wherein:
each of the sidewall spacers includes a lower portion and an upper portion disposed on the lower layer, and
the lower portion includes an air gap.

2. The semiconductor device of claim 1, wherein:
the gate structure includes a gate dielectric layer and a gate electrode layer, and
a part of the gate dielectric layer is disposed between the air gap and the gate electrode layer.

3. The semiconductor device of claim 2, wherein the gate electrode layer includes one or more work function adjustment layers and a body metal layer.

4. The semiconductor device of claim 2, wherein:
the gate structure further includes a cap insulating layer over the gate electrode layer,
the sidewall spacers are disposed on opposing side faces of the cap insulating layer, and
a height of a top of the air gap is lower than a height of a top of the gate electrode layer.

5. The semiconductor device of claim 1, wherein a height of a top of the air gap is equal to or greater than a height of a top of the source/drain epitaxial layer.

6. The semiconductor device of claim 1, further comprising an etch stop layer disposed on a side face of the lower portion and on the source/drain epitaxial layer.

7. The semiconductor device of claim 6, wherein no etch stop layer is disposed on a side face of the upper portion.

8. The semiconductor device of claim 1, wherein the air gap is formed by a first vertical portion adjacent to the gate structure and a second vertical portion opposite to the first vertical portion and made of a different material than the first vertical portion.

9. The semiconductor device of claim 1, wherein a top of the air gap from the isolation insulating layer is 20-70% of a height of the sidewall spacers.

10. The semiconductor device of claim 1, wherein a top of the air gap from the isolation insulating layer is 20-90% of a height of the gate structure.

11. The semiconductor device of claim 1, wherein the sidewall spacers are made of SiCN or SiOCN.

12. The semiconductor device of claim 1, wherein the upper portion is made of different material than the lower portion.

13. The semiconductor device of claim 1, wherein a width of the air gap is in a range from 0.5 nm to 8.0 nm.

14. A semiconductor device, comprising:
a fin structure disposed over a substrate;
an isolation insulating layer, from which an upper portion of the fin structure protrude, and in which a lower portion of the fin structure is embedded;
a gate structure disposed over the upper portion of the fin structure, the gate structure includes a gate dielectric layer having a U-shape cross section, a gate electrode layer and a insulating cap layer disposed on the gate electrode layer;
sidewall spacers disposed on opposing side faces of the gate structure; and
a source/drain epitaxial layer, wherein:
each of the sidewall spacers includes a lower portion and an upper portion disposed on the lower layer, and
the lower portion includes an air gap.

15. The semiconductor device of claim 14, wherein an uppermost portion of the air gap from the isolation insulating layer is 20-70% of a height of the sidewall spacer layers.

16. The semiconductor device of claim 14, wherein an uppermost portion of the air gap is lower than an uppermost portion of the gate electrode.

17. The semiconductor device of claim 14, wherein a height of a top of the air gap is equal to or greater than a height of a top of the source/drain epitaxial layer.

18. A semiconductor device, comprising:
fin structures disposed over a substrate;
an isolation insulating layer, from which an upper portion of each of the fin structures protrude, and in which a lower portion of each of the fin structures is embedded;
a gate structure disposed over the upper portion of each of the fin structures; and
sidewall spacers disposed on opposing side surfaces of the gate structure, wherein:
each of the sidewall spacers includes a lower portion and an upper portion disposed on the lower layer, and
the lower portion includes an air gap.

19. The semiconductor device of claim 18, wherein the sidewall spacers are made of SiCN or SiOCN.

20. The semiconductor device of claim 18, wherein a width of the air gap is in a range from about 0.5 nm to about 8.0 nm.

* * * * *